(12) United States Patent
Takahashi et al.

(10) Patent No.: US 12,531,533 B2
(45) Date of Patent: Jan. 20, 2026

(54) SEMICONDUCTOR DEVICE, AMPLIFIER, AND ELECTRONIC DEVICE

(71) Applicant: SEMICONDUCTOR ENERGY LABORATORY CO., LTD., Atsugi (JP)

(72) Inventors: Kei Takahashi, Kanagawa (JP); Takayuki Ikeda, Kanagawa (JP); Shuji Fukai, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 612 days.

(21) Appl. No.: 17/910,057

(22) PCT Filed: Mar. 16, 2021

(86) PCT No.: PCT/IB2021/052149
§ 371 (c)(1),
(2) Date: Sep. 8, 2022

(87) PCT Pub. No.: WO2021/191726
PCT Pub. Date: Sep. 30, 2021

(65) Prior Publication Data
US 2023/0353110 A1    Nov. 2, 2023

(30) Foreign Application Priority Data

Mar. 27, 2020 (JP) .................................. 2020-057124
Jan. 22, 2021 (JP) .................................. 2021-008393

(51) Int. Cl.
*H03F 3/72*    (2006.01)
*H03F 3/217*   (2006.01)
(Continued)

(52) U.S. Cl.
CPC ............. *H03F 3/72* (2013.01); *H03F 3/2171* (2013.01); *H10D 84/038* (2025.01);
(Continued)

(58) Field of Classification Search
CPC .. H03F 3/72; H03F 3/2171; H03F 2203/7227; H03F 3/2173; H03F 2200/339;
(Continued)

(56) References Cited

U.S. PATENT DOCUMENTS 5,973,368 A    10/1999    Pearce et al.
6,420,930 B1   7/2002     Takagishi
(Continued)

FOREIGN PATENT DOCUMENTS

JP    2004-328329 A    11/2004
JP    2005-268662 A    9/2005
(Continued)

OTHER PUBLICATIONS

International Search Report (Application No. PCT/IB2021/052149) Dated Jul. 13, 2021.
(Continued)

*Primary Examiner* — Hieu P Nguyen
(74) *Attorney, Agent, or Firm* — NIXON PEABODY LLP; Jeffrey L. Costellia

(57) ABSTRACT

A small semiconductor device is provided. A semiconductor device with low power consumption is provided. A semiconductor device with a high degree of integration is provided. The semiconductor device includes a first transistor, an insulating layer over the first transistor, a conductive layer, and a gate driver; part of the conductive layer is provided to be embedded in the insulating layer; the gate driver includes a second transistor and a third transistor; the second transistor and the third transistor are stacked and provided over the first transistor; the second transistor and
(Continued)

the third transistor each contain a metal oxide in a channel formation region; one of a source and a drain of the second transistor and one of a source and a drain of the third transistor are electrically connected to a gate of the first transistor through the conductive layer; the gate driver is supplied with a first potential and a second potential; and the gate driver has a function of selecting the first potential or the second potential and supplying the selected potential to the gate of the first transistor.

18 Claims, 19 Drawing Sheets

(51) Int. Cl.
    *H10D 84/03*    (2025.01)
    *H10D 84/80*    (2025.01)
    *H10D 88/00*    (2025.01)

(52) U.S. Cl.
    CPC ........... *H10D 84/811* (2025.01); *H10D 88/01* (2025.01); *H03F 2203/7227* (2013.01)

(58) Field of Classification Search
    CPC . H03F 2200/391; H03F 3/185; H10D 84/038; H10D 84/811; H10D 88/01; H10D 30/6734; H10D 30/6755; H10D 84/08; H10D 84/83; H10D 87/00; H10D 88/00; H10D 84/00; H03K 2217/0063; H03K 2217/0072; H03K 17/79; H03K 2217/0081; H03K 17/6871
    USPC ........................ 330/10, 251, 207 A
    See application file for complete search history.

(56) References Cited

U.S. PATENT DOCUMENTS

| | | | |
|---|---|---|---|
| 7,049,850 B2 | 5/2006 | Shimizu | |
| 7,432,759 B2* | 10/2008 | Cho | ........................ H03F 3/217 |
| | | | 330/10 |
| 7,795,619 B2 | 9/2010 | Hara | |
| 9,231,535 B2* | 1/2016 | Du | ........................ H03F 3/2171 |
| 9,246,476 B2 | 1/2016 | Takahashi | |
| 9,866,188 B2* | 1/2018 | Chang | .................. H03K 5/1515 |
| 10,243,546 B2 | 3/2019 | de Rooij et al. | |
| 10,505,504 B2 | 12/2019 | Miyake | |
| 11,342,892 B2 | 5/2022 | Akutagawa | |
| 2006/0061419 A1 | 3/2006 | Edwards | |
| 2008/0284508 A1 | 11/2008 | Walker et al. | |
| 2018/0226926 A1 | 8/2018 | Miyake | |
| 2021/0091729 A1 | 3/2021 | Akutagawa | |

FOREIGN PATENT DOCUMENTS

| | | |
|---|---|---|
| JP | 2006-210828 A | 8/2006 |
| JP | 2010-081202 A | 4/2010 |
| JP | 2013-236208 A | 11/2013 |
| JP | 2017-073583 A | 4/2017 |
| JP | 2019-186443 A | 10/2019 |
| WO | WO-2017/061479 | 4/2017 |
| WO | WO-2017/205618 | 11/2017 |
| WO | WO-2019/131162 | 7/2019 |

OTHER PUBLICATIONS

Written Opinion (Application No. PCT/IB2021/052149) Dated Jul. 13, 2021.

Tamura.H et al., "Embedded SRAM and Cortex-M0 Core Using a 60-nm Crystalline Oxide Semiconductor", IEEE Micro, Nov. 1, 2014, vol. 34, No. 6, pp. 42-53.

\* cited by examiner

FIG. 19A
7000
FIG. 19B
7210
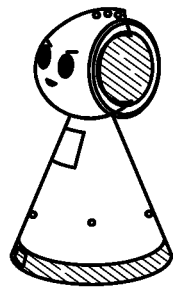
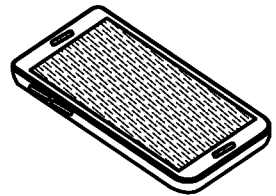
FIG. 19C
7400
FIG. 19D
7500
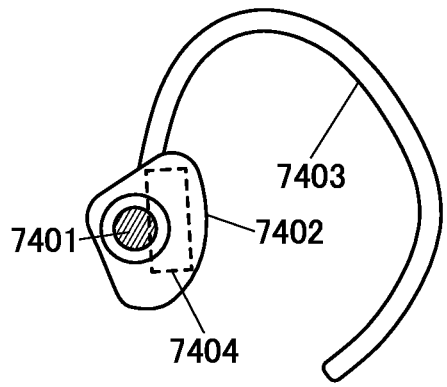
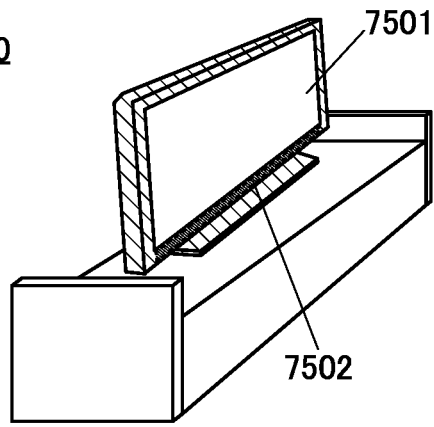
7403
7401
7402
7404
7501
7502
FIG. 19E
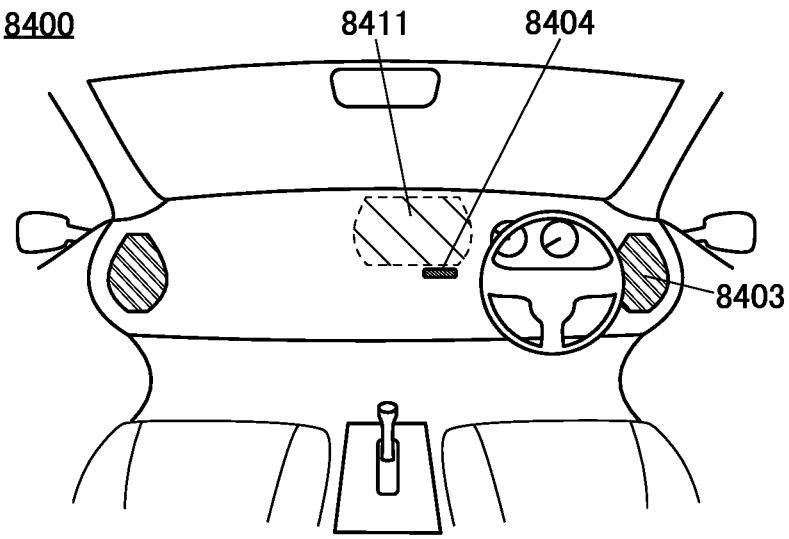
8400    8411    8404
8403

SEMICONDUCTOR DEVICE, AMPLIFIER, AND ELECTRONIC DEVICE

TECHNICAL FIELD

One embodiment of the present invention relates to a semiconductor device. In particular, one embodiment of the present invention relates to a semiconductor device functioning as a driver circuit for driving a power device for power supply. One embodiment of the present invention relates to an amplifier. One embodiment of the present invention relates to an electronic component. One embodiment of the present invention relates to an electronic device of one embodiment of the present invention. One embodiment of the present invention relates to manufacturing methods of a semiconductor device, an amplifier, an electronic component, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specific examples of the technical field of one embodiment of the present invention disclosed in this specification include a display device, a light-emitting device, a power storage device, an imaging device, a memory device, a vehicle, a moving object, driving methods thereof, and manufacturing methods thereof.

BACKGROUND ART

High-power transistors are used for driving a heavy load such as a motor and are required to have high-speed switching characteristics, low power consumption, high reliability, a wide operating temperature range, and the like. An example of a driver circuit for a high-power transistor is described in Patent Document 1.

Driving of a power transistor is sometimes performed under PWM (Pulse Width Modulation) control. PWM control is performed in accordance with a PWM signal output from a microcomputer or the like. The voltage of the PWM signal is too low to directly drive the power transistor having a large gate capacitance. Therefore, the PWM signal needs to be converted into a high-voltage signal and supplied to the power transistor. A driver circuit for converting the PWM signal to a high-voltage signal includes a transistor including silicon. For example, Patent Document 2 discloses a structure of a semiconductor device in which an n-channel transistor and a p-channel transistor are provided over a silicon substrate and the on/off of a power transistor is controlled.

A transistor including a metal oxide in a channel formation region (hereinafter, such a transistor may be referred to as an "oxide semiconductor transistor" or an "OS transistor") is known. A variety of semiconductor devices have been fabricated by a CMOS process for a hybrid of an OS transistor and a Si transistor (Non-Patent Document 1). As disclosed in Non-Patent Document 1, an OS transistor can be provided by being stacked over a Si transistor. In addition, an OS transistor can be provided with a first gate electrode (also referred to as a gate or a front gate) and a second gate electrode (also referred to as a back gate).

REFERENCES

Patent Documents

[Patent Document 1] PCT International Publication No. 2017/205618

[Patent Document 2] Japanese Published Patent Application No. 2004-328329

Non-Patent Document

[Non-Patent Document 1] H. Tamura et al., "Embedded SRAM and Cortex-M0 Core Using a 60-nm Crystalline Oxide Semiconductor," IEEE MICRO, 2014, Vol. 34, No. 6, pp. 42-53.

SUMMARY OF THE INVENTION

Problems to be Solved by the Invention

An object of one embodiment of the present invention is to provide a small semiconductor device, a small amplifier, a small electronic device, or the like. Another object of one embodiment of the present invention is to provide a semiconductor device, an amplifier, an electronic device, or the like which has low power consumption. Another object of one embodiment of the present invention is to provide a semiconductor device, an amplifier, an electronic device, or the like which has a high degree of integration. Another object of one embodiment of the present invention is to prevent malfunction of a semiconductor device. Another object of one embodiment of the present invention is to inhibit an increase in manufacturing costs. Another object of one embodiment of the present invention is to provide a novel semiconductor device, a novel amplifier, a novel electronic component, a novel electronic device, a novel vehicle, a novel moving object, or the like.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, or the like and can be extracted from the description by those skilled in the art. Note that one embodiment of the present invention is to solve at least one of the objects listed above and/or the other objects.

Means for Solving the Problems

One embodiment of the present invention is a semiconductor device which includes a first transistor, a second transistor, a gate driver, a first comparator circuit, a second comparator circuit, and a first terminal and in which the gate driver includes a third transistor and a fourth transistor; one of a source and a drain of the first transistor and one of a source and a drain of the second transistor are electrically connected to the first terminal; the third transistor and the fourth transistor are stacked and provided over the first transistor; one of a source and a drain of the third transistor and one of a source and a drain of the fourth transistor are electrically connected to a gate of the first transistor; the first comparator circuit is supplied with an analog signal and a first potential; the first comparator circuit has a function of outputting, as a first output signal, a signal responsive to the result of comparing the analog signal and the first potential; the second comparator circuit is supplied with the first output signal and a carrier wave; the second comparator circuit has a function of outputting, as a second output signal, a signal responsive to the result of comparing the first output signal and the carrier wave; and the gate driver has a function of supplying a desired potential to each of the gate of the first transistor and a gate of the second transistor and thereby outputting a signal responsive to the second output signal to the first terminal.

In the above structure, it is preferable that the first transistor contain, in a channel formation region, one or more selected from silicon, germanium, silicon-germanium, gallium arsenide, gallium aluminum arsenide, indium phosphide, silicon carbide, zinc selenide, gallium nitride, and gallium oxide.

The semiconductor device which has the above structure and in which the third transistor and the fourth transistor each contain a metal oxide in a channel formation region, and the metal oxide contains indium and zinc.

In the above structure, the carrier wave is preferably a triangular wave.

Another embodiment of the present invention is an amplifier which includes a first transistor, a second transistor, a gate driver, a power supply control circuit, an inductor, a capacitor, a first terminal, a second terminal, and a third terminal and in which the gate driver includes a third transistor and a fourth transistor; the third transistor and the fourth transistor are each stacked and provided over the first transistor; one of a source and a drain of the first transistor and one of a source and a drain of the second transistor are electrically connected to the first terminal; one of a source and a drain of the third transistor and one of a source and a drain of the fourth transistor are electrically connected to a gate of the first transistor; the power supply control circuit is electrically connected to the gate driver and the second terminal; one terminal of the inductor is electrically connected to the first terminal; the other terminal of the inductor is electrically connected to the third terminal and one terminal of the capacitor; the power supply control circuit has a function of generating a signal based on an analog signal supplied from the second terminal and supplying the signal to the gate driver; and the amplifier has a function of outputting an amplified signal of the analog signal from the third terminal.

In the above structure, it is preferable that the power supply control circuit include a first comparator circuit and a second comparator circuit, the first comparator circuit have a function of outputting, as a first output signal, a signal responsive to the result of comparing the analog signal and the first potential, the second comparator circuit have a function of outputting, as a second output signal, a signal responsive to the result of comparing the first output signal and a carrier wave, and the gate driver have a function of supplying a desired potential to each of the gate of the first transistor and a gate of the second transistor and thereby outputting a signal responsive to the second output signal to the first terminal.

In the above structure, it is preferable that the first terminal or the third terminal be electrically connected to the second terminal.

Another embodiment of the present invention is an electronic device including the amplifier described above and a speaker.

Another embodiment of the present invention is a semiconductor device which includes a first transistor, an insulating layer over the first transistor, a conductive layer, and a gate driver and in which part of the conductive layer is provided to be embedded in the insulating layer; the gate driver includes a second transistor and a third transistor; the second transistor and the third transistor are stacked and provided over the first transistor; the second transistor and the third transistor each contain a metal oxide in a channel formation region; the metal oxide contains indium and zinc; one of a source and a drain of the second transistor and one of a source and a drain of the third transistor are electrically connected to a gate of the first transistor through the conductive layer; the gate driver is supplied with a first potential and a second potential, and the gate driver has a function of selecting the first potential or the second potential and supplying the first potential selected or the second potential selected to the gate of the first transistor.

In the above structure, it is preferable that the gate driver include a level shift circuit and the level shift circuit have a function of generating a potential to be supplied to each of a gate of the second transistor and a gate of the third transistor.

In the above structure, it is preferable that the first transistor contain, in a channel formation region, one or more selected from silicon, germanium, silicon-germanium, gallium arsenide, gallium aluminum arsenide, indium phosphide, silicon carbide, zinc selenide, gallium nitride, and gallium oxide.

In the above structure, it is preferable that the metal oxide contain one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, and magnesium.

It is preferable that the above structure include a drain electrode, a first diffusion layer over the drain electrode, a semiconductor region and a second diffusion layer that are over the first diffusion layer, a gate electrode over the semiconductor region, and a source electrode over the second diffusion layer, and the first diffusion layer include a region functioning as a drain of the first transistor, the semiconductor region include a region functioning as the channel formation region of the first transistor, and the second diffusion layer include a region functioning as a source of the first transistor.

It is preferable that the above structure include a second semiconductor region joined to the semiconductor region, the polarity of the second diffusion layer and the polarity of the second semiconductor region be different from each other, and the first diffusion layer, the second semiconductor region, and the second diffusion layer each include a region functioning as part of a diode element.

In the above structure, the second semiconductor region is preferably a region joined to the second diffusion layer.

In the above structure, the second semiconductor region and the second diffusion layer preferably form a pn junction.

Effect of the Invention

One embodiment of the present invention can provide a small semiconductor device, a small amplifier, a small electronic device, or the like. One embodiment of the present invention can provide a semiconductor device, an amplifier, an electronic device, or the like which has low power consumption. One embodiment of the present invention can provide a semiconductor device, an amplifier, an electronic device, or the like which has a high degree of integration. One embodiment of the present invention can prevent malfunction of a semiconductor device. One embodiment of the present invention can inhibit an increase in manufacturing costs. One embodiment of the present invention can provide a novel semiconductor device, a novel amplifier, a novel electronic component, a novel electronic device, a novel vehicle, a novel moving object, or the like.

Note that the effects of one embodiment of the present invention are not limited to the effects listed above. The effects listed above do not preclude the existence of other effects. Note that the other effects are effects that are not described in this section and will be described below. The effects that are not described in this section will be derived from the description of the specification, the drawings, or the like and can be extracted from the description by those skilled in the art. Note that one embodiment of the present invention is to have at least one of the effects listed above and/or the other effects. Accordingly, depending on the case, one embodiment of the present invention does not have the effects listed above in some cases.

BRIEF DESCRIPTION OF THE DRAWINGS

FIG. 19A is an example of an electronic device of one embodiment of the present invention. FIG.

FIG. 19B is an example of an electronic device of one embodiment of the present invention. FIG. 19C is an example of an electronic device of one embodiment of the present invention. FIG. 19D is an example of an electronic device of one embodiment of the present invention. FIG. 19E is an example of an electronic device of one embodiment of the present invention.

MODE FOR CARRYING OUT THE INVENTION

Figure 1A:
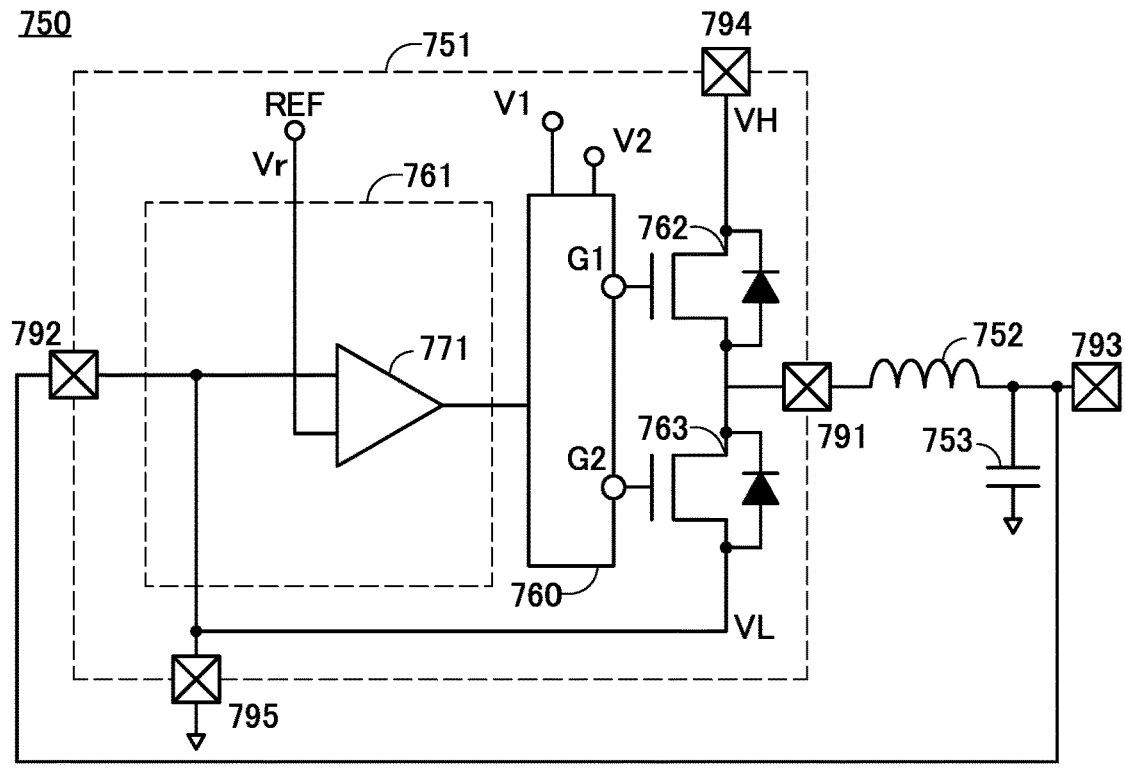
FIG. 1A is a circuit diagram showing an example of an amplifier of one embodiment of the present invention.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments or claims. For another example, a "first" component in one embodiment in this specification and the like can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

The position, size, range, and the like of each component illustrated in the drawings and the like are not accurately represented in some cases to facilitate understanding of the invention. Therefore, the disclosed invention is not necessarily limited to the position, size, range, or the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In this specification and the like, the terms "electrode" and "wiring" do not functionally limit these components. For example, an "electrode" is used as part of a "wiring" in some cases, and vice versa. Furthermore, the term "electrode" or "wiring" also encompasses the case where a plurality of "electrodes" or "wirings" are formed in an integrated manner, for example.

In this specification and the like, a "terminal" sometimes refers to a wiring or an electrode connected to a wiring, for example. Moreover, in this specification and the like, part of a "wiring" is referred to as a "terminal" in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Functions of a source and a drain are interchanged with each other depending on operation conditions, for example, when a transistor of a different polarity is employed or when the direction of current flow is changed in a circuit operation; therefore, it is difficult to define which is the source or the drain. Thus, the terms "source" and "drain" can be interchanged with each other in this specification.

In this specification and the like, the expression "electrically connected" encompasses the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

In this specification, in the case where an etching treatment is performed after a resist mask is formed, the resist mask is removed after the etching treatment unless otherwise specified.

A voltage refers to a potential difference between a given potential and a reference potential (e.g., a ground potential or a source potential) in many cases. Therefore, the terms "voltage" and "potential" can be replaced with each other in many cases.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, in some cases, an "on-state current" means a current that flows between a source and a drain when a transistor is in an on state.

Furthermore, in some cases, an "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is the ground potential, VSS is a potential lower than the ground potential, and in the case where VSS is the ground potential, VDD is a potential higher than the ground potential.

In this specification and the like, a gate refers to part or the whole of a gate electrode and a gate wiring. A gate wiring refers to a wiring for electrically connecting a gate electrode of at least one transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting a source electrode of at least one transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting a drain electrode of at least one transistor to another electrode or another wiring.

Note that a semiconductor device means a circuit having a semiconductor element (e.g., a transistor or a diode) and a device having the circuit. The semiconductor device also means devices that can function by utilizing semiconductor characteristics. For example, an integrated circuit, a chip having an integrated circuit, a display device, a light-emitting device, a lighting device, and an electronic device are all semiconductor devices.

Embodiment 1

In this embodiment, an amplifier of one embodiment of the present invention will be described.

FIG. 1A, FIG. 1B, FIG. 2A, and FIG. 3 show the amplifier of one embodiment of the present invention.

An amplifier 750 shown in FIG. 1A includes a semiconductor device 751, an inductor 752, a capacitor 753, and a terminal 793. The inductor 752 is sometimes referred to as a coil. The amplifier 750 can process an input signal supplied to a terminal 792 and perform output from the terminal 793. The amplifier 750 is sometimes referred to as an amplifier.

The input signal supplied to the terminal 792 is, for example, an analog signal. In the case where the input signal is a digital signal, the digital signal is converted into an analog signal by a digital/analog converter circuit and then, the analog signal is supplied to the terminal 792, for example.

The semiconductor device 751 includes a gate driver 760, a power supply control circuit 761, a transistor 762, a transistor 763, a terminal 791, the terminal 792, a terminal 794, and a terminal 795. The gate driver 760 includes a terminal G1 and a terminal G2. The power supply control circuit 761 includes a comparator 771. A terminal V1 and a terminal V2 are connected to the gate driver 760. A terminal REF is connected to the power supply control circuit 761. The comparator is referred to as a comparator circuit in some cases.

One terminal of the inductor 752 is electrically connected to the terminal 791, and the other terminal of the inductor 752 is electrically connected to one electrode of the capacitor 753 and the terminal 793. The other terminal of the capacitor 753 is supplied with a ground potential.

The semiconductor device 751 has a function of amplifying or converting the input signal supplied to the terminal 792, for example, and performing output from the terminal 791. The inductor 752 and the capacitor 753 can function as a low-pass filter. The low-pass filter has a function of attenuating a particular frequency component of an output signal from the terminal 791 and performing output from the terminal 793.

The output from the terminal 793 is fed back to the terminal 792. Although FIG. 1A shows an example in which feedback is performed with the terminal 793 being electrically connected to the terminal 792, feedback may be performed with the terminal 791 being electrically connected to the terminal 792.

In the semiconductor device 751, the terminal 792 is electrically connected to one of a non-inverting input terminal and an inverting input terminal of the comparator 771, the terminal REF is electrically connected to the other. The terminal REF is supplied with a reference potential Vr. An output terminal of the comparator 771 is electrically connected to the gate driver 760.

The terminal G1 and the terminal G2 of the gate driver 760 are electrically connected to a gate of the transistor 762 and a gate of the transistor 763, respectively. One of a source and a drain of the transistor 762 and one of a source and a drain of the transistor 763 are electrically connected to the terminal 791. The other of the source and the drain of the transistor 762 is electrically connected to the terminal 794, and the other of the source and the drain of the transistor 763 is electrically connected to the terminal 795.

The terminal 794 is supplied with a high potential VH and the terminal 795 is supplied with a low potential VL, for example. The ground potential may be used as the low potential VL. In the case where the transistor 763 is in an on state and the transistor 762 is in an off state, the terminal 791 is in a state where it is electrically connected to the terminal 795, and the terminal 791 is supplied with the low potential VL. In the case where the transistor 763 is in an off state and the transistor 762 is in an on state, the terminal 791 is in a state where it is electrically connected to the terminal 794, and the terminal 791 is supplied with the high potential VH.

The comparator 771 has a function of outputting, to the gate driver 760, the result of comparing the signal supplied to the terminal 792 and the reference potential Vr.

The gate driver 760 can control the gate of the transistor 762 and the gate of the transistor 763 on the basis of the output from the comparator 771 and can thereby output, from the terminal 791, a signal whose amplitude width is the difference between the high potential VH and the low potential VL.

Figure 1B:
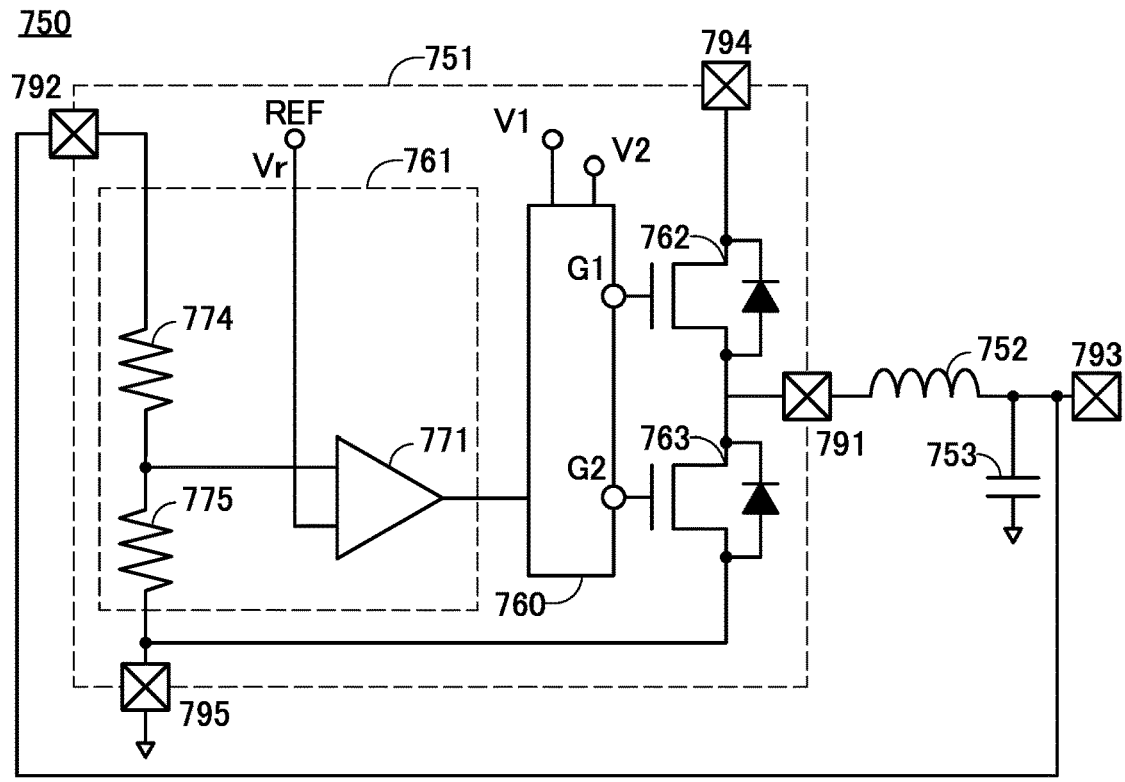
FIG. 1B is a circuit diagram showing an example of the amplifier of one embodiment of the present invention.

As shown in FIG. 1B, the signal supplied to the terminal 792 may be resistively divided and may be supplied to the non-inverting input terminal or the inverting input terminal of the comparator 771. FIG. 1B shows an example of performing resistive division with a resistor 774 and a resistor 775 provided between the terminal 792 and the terminal 795.

Figure 2A:
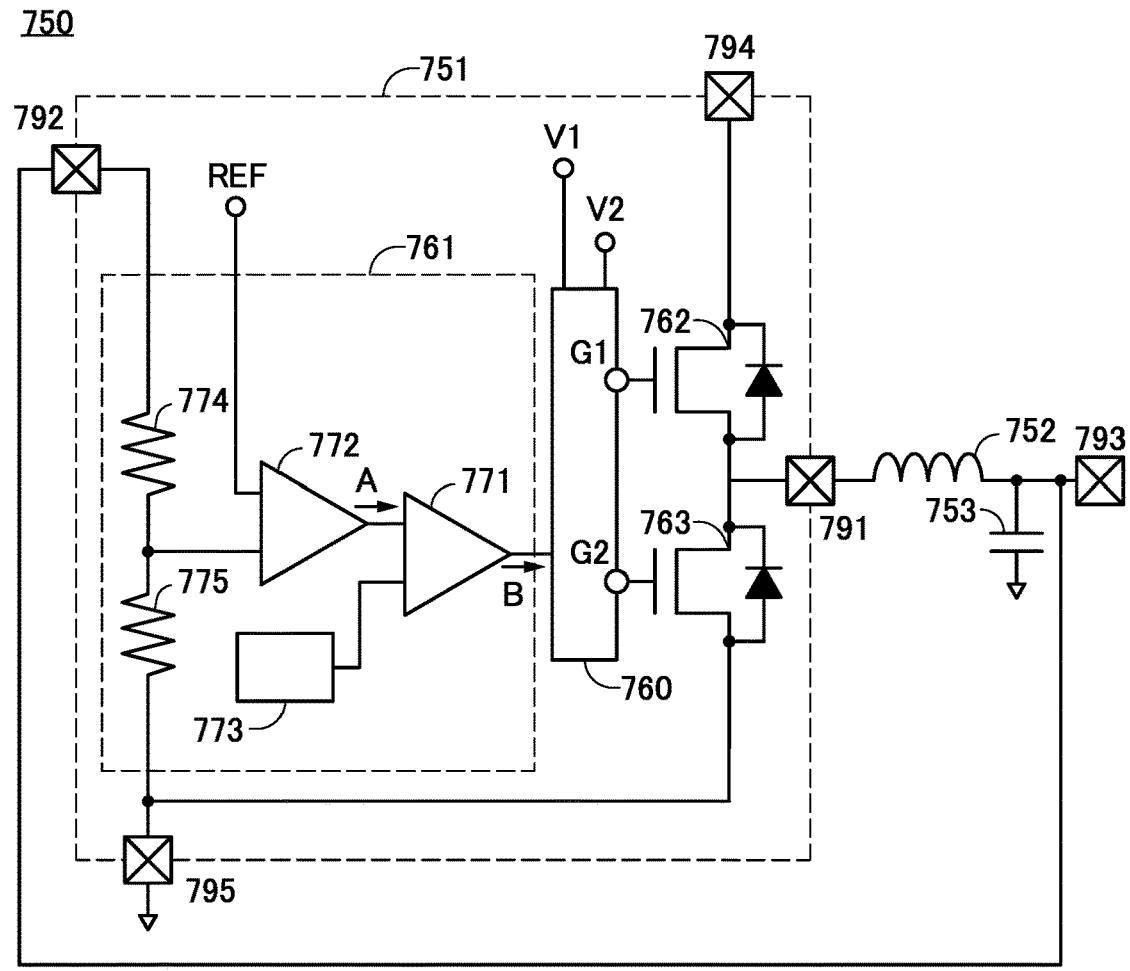
FIG. 2A is a circuit diagram showing an example of an amplifier of one embodiment of the present invention.

The amplifier 750 shown in FIG. 2A is different from FIG. 1B in the configuration of the power supply control circuit 761. The power supply control circuit 761 of the amplifier 750 shown in FIG. 2A includes the comparator 771, a comparator 772, a carrier wave generation circuit 773, the resistor 774, the resistor 775, and the terminal REF. The signal supplied to the terminal 792 is resistively divided by the resistor 774 and the resistor 775 and is supplied to one of a non-inverting input terminal and an inverting input terminal of the comparator 772. To the other of the non-inverting input terminal and the inverting input terminal of the comparator 772, the terminal REF is electrically connected. An output terminal of the comparator 772 is electrically connected to the one of the non-inverting input terminal and the inverting input terminal of the comparator 771, and the carrier wave generation circuit 773 is electrically connected to the other. The output terminal of the comparator 771 is electrically connected to the gate driver 760.

The carrier wave generation circuit 773 has a function of generating and outputting a carrier wave. The carrier wave can have any of a variety of waveforms, an example of which is a triangular wave.

The comparator 772 has a function of outputting, to the comparator 771, a signal A that is obtained as the result of comparing the input signal from the terminal 792 and the reference potential Vr. The comparator 771 has a function of outputting, to the gate driver 760, a signal B that is obtained as the result of comparing the signal A and the carrier wave supplied from the carrier wave generation circuit 773.

The control method of the power supply control circuit 761 shown in FIG. 1A and FIG. 1B is sometimes referred to as a hysteresis control method, and the control method of the power supply control circuit 761 shown in FIG. 2A is sometimes referred to as a PWM (Pulse Width Modulation) control method.

The transistor 762 and the transistor 763 are sometimes referred to as power MOSFETs or power transistors. The transistor 762 and the transistor 763 may each include a parasitic diode. The parasitic diode has functions of backflow prevention, rectification, and the like. In addition, the parasitic diode has a function of reducing, for example, electric field concentration at the time of applying a high voltage between the source and the drain, and inhibiting breakage or deterioration of the transistor. A separate diode element may be provided instead of or in combination with the parasitic diode to be connected in parallel with the transistor.

Figure 2B:
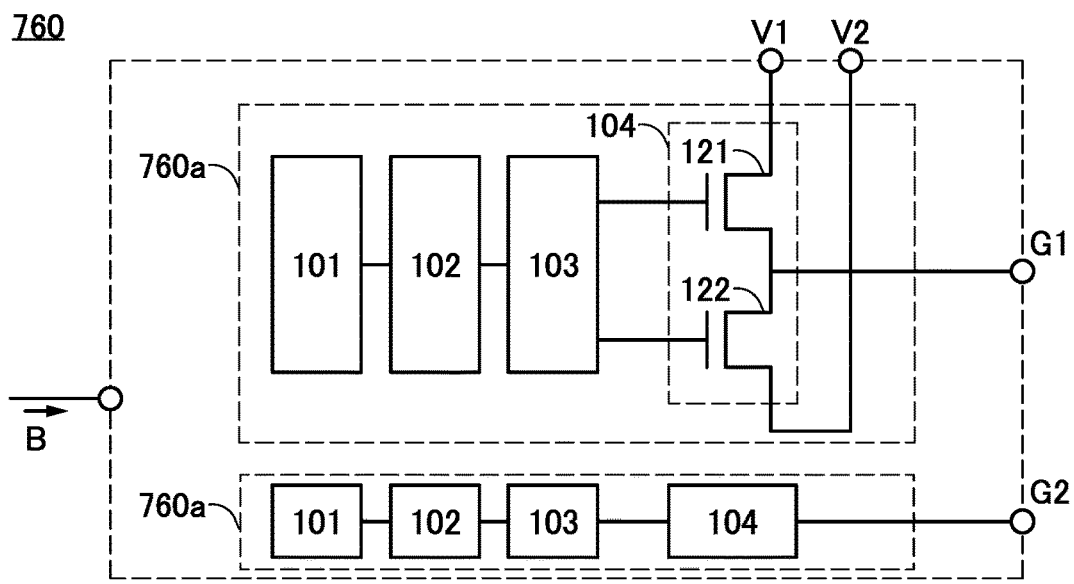
FIG. 2B is a block diagram showing a configuration of a circuit of one embodiment of the present invention.

FIG. 2B shows a configuration example of the gate driver 760. The details of the configuration of the gate driver 760 will be described later.

The gate driver 760 shown in FIG. 2B includes the terminal G1, the terminal G2, and two driver circuits 760a. One of the two driver circuits 760a is connected to the terminal G1, and the other is connected to the terminal G2. The driver circuit 760a includes a buffer circuit 104 connected to the terminal G1 or the terminal G2, a buffer circuit 103 connected to the buffer circuit 104, a level shift circuit 102 connected to the buffer circuit 103, and a buffer circuit 101 connected to the level shift circuit 102. The buffer circuit 104 includes a transistor 121 and a transistor 122. One of a source and a drain of the transistor 121 is electrically connected to the terminal V1, and the other is electrically connected to one of a source and a drain of the transistor 122. The terminal V2 is electrically connected to the other of the source and the drain of the transistor 122.

A transistor including an oxide semiconductor (OS), which is a kind of metal oxide, in a semiconductor layer where a channel is formed (such a transistor is also referred to as an "OS transistor" or "OS-FET") is preferably used as each of the transistor 121 and the transistor 122. An OS transistor can be formed by a thin film formation method such as a sputtering method, a CVD method, or an ALD method. When the transistor 121 and the transistor 122 are OS transistors and at least one of the transistor 762 and the transistor 763 is a transistor whose channel formation region contains one or more selected from silicon, germanium, silicon-germanium, gallium arsenide, gallium aluminum arsenide, indium phosphide, silicon carbide, zinc selenide, gallium nitride, and gallium oxide, the OS transistors can be stacked and provided by the thin film method or the like after the at least one of the transistor 762 and the transistor 763 is provided. Thus, the circuit area, chip area, and the like of the amplifier 750 can be small. Moreover, the degree of integration of the amplifier 750 can be increased. Since the transistor 762, the transistor 763, and the like and the OS transistor can be stacked and provided, wiring runs can be reduced, improving the characteristics, reliability, and the like of the amplifier 750 in some cases.

Figure 3:
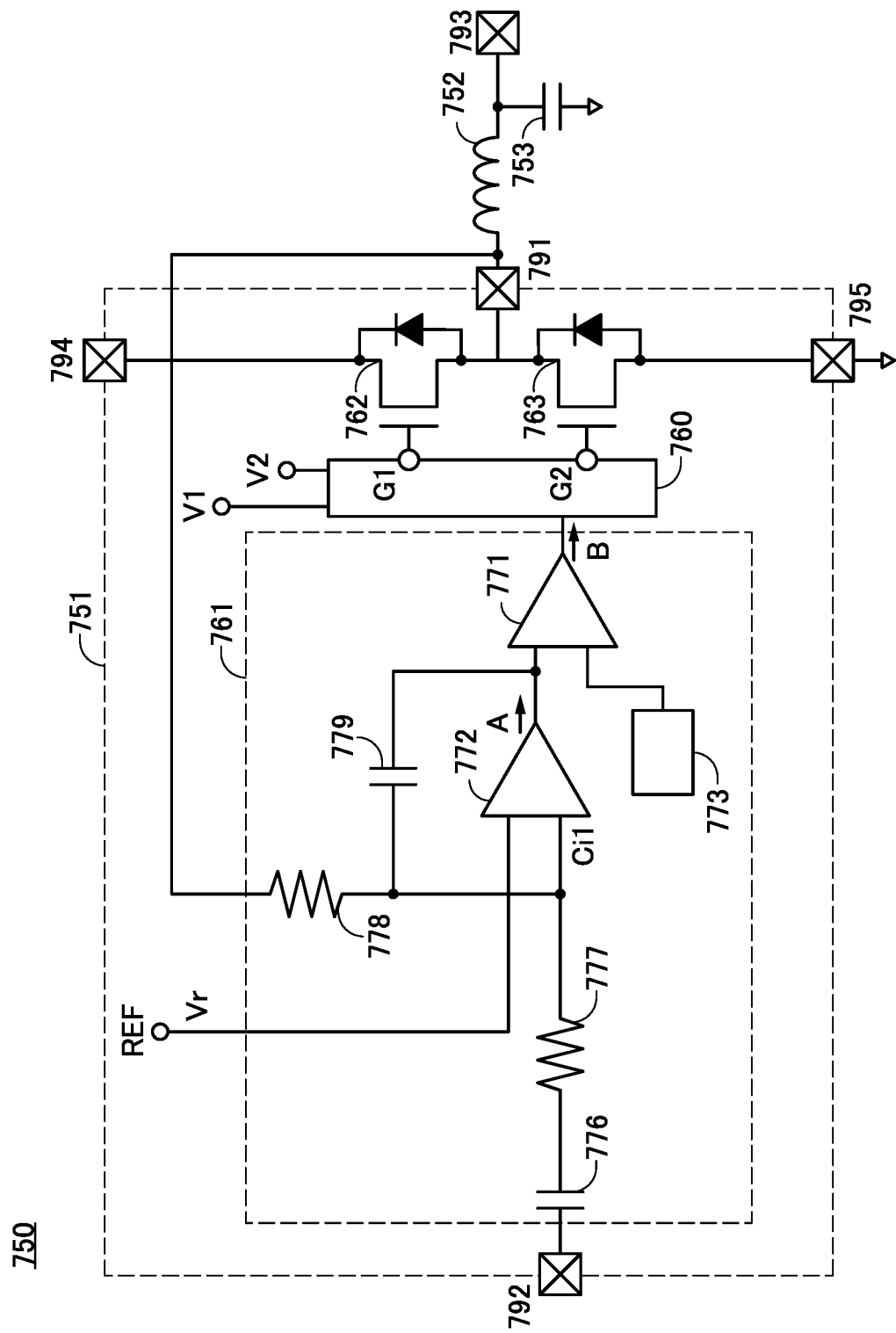
FIG. 3 is a circuit diagram showing an example of an amplifier of one embodiment of the present invention.

The amplifier 750 shown in FIG. 3 is different from FIG. 2 in the configuration of the power supply control circuit 761 and includes a capacitor 776, a resistor 777, a resistor 778, and a capacitor 779. Instead of the output from the terminal 793, the output from the terminal 791 is fed back to the one of the non-inverting input terminal and the inverting input terminal of the comparator 772 (hereinafter referred to as a terminal Ci1) through the resistor 778.

In FIG. 3, the capacitor 776 and the resistor 777 are provided between the terminal Ci1 and the terminal 792. One electrode of the capacitor 776 is electrically connected to the terminal 792, and the other electrode thereof is electrically connected to one terminal of the resistor 777. The other terminal of the resistor 777 is electrically connected to the terminal Ci1, one terminal of the resistor 778, and one electrode of the capacitor 779. The other terminal of the resistor 778 is electrically connected to the terminal 791. The other electrode of the capacitor 779 is electrically connected to the output terminal of the comparator 772.

The comparator 772 and the capacitor 779 function as an integrating circuit.

Supplying the feedback from the terminal 791 to the terminal Ci1 can reduce the distortion, noise, or the like of the output signal obtained at the terminal 793, for example.

The amplifier 750 shown in FIG. 3 can be suitably used for amplifying an acoustic signal.

This embodiment can be combined with the description of the other embodiments as appropriate.

Embodiment 2

In this embodiment, the configuration and operation of a driver circuit applicable to a semiconductor device of one embodiment of the present invention, and an example of the structure of the semiconductor device including the driver circuit are described.

Figure 4:
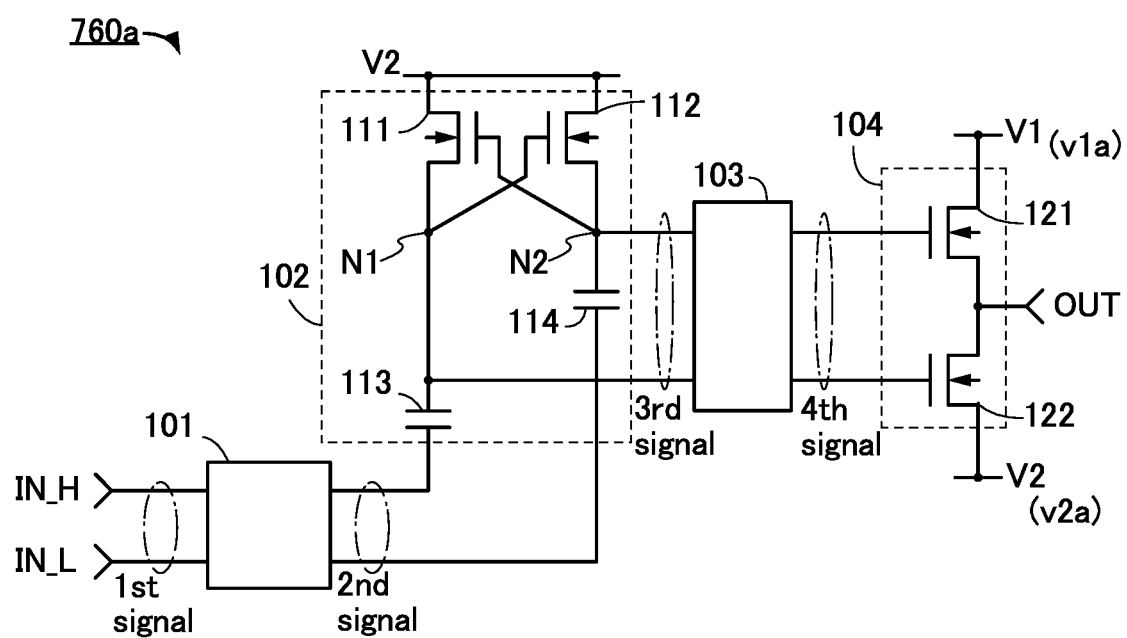
FIG. 4 is a circuit diagram showing a configuration of a circuit of one embodiment of the present invention.

FIG. 4 is a circuit diagram showing an example of the driver circuit 760a included in the gate driver 760 in the above embodiment. The driver circuit 760a shown in FIG. 4 includes the buffer circuit 101, the level shift circuit 102, the buffer circuit 103, and the buffer circuit 104.

In the driver circuit 760a described in this embodiment, the buffer circuit 101, the buffer circuit 103, the buffer circuit 104, and the level shift circuit 102 are configured by transistors having the same polarity. Thus, in the driver circuit 760a, the transistors provided in the driver circuit 760a can be configured by transistors having a single polarity.

Furthermore, the driver circuit 760a has a configuration in which a capacitor is provided in the level shift circuit 102, and a signal to be stepped up through the capacitor is supplied and is stepped up using capacitive coupling in the capacitor. With this configuration, the voltage applied between the source and the drain of the transistor in the level shift circuit 102 can be made lower than the voltage applied to the capacitor in the level shift circuit 102, so that dielectric breakdown of the transistor can be inhibited.

Next, the circuits included in the driver circuit 760a are described.

The buffer circuit 101 is a circuit having a function of converting a PWM signal output from a microcomputer or the like to a signal obtained by one or both of stepping up of the PWM signal to a signal that can operate the level shift circuit 102 and improvement of the electric charge supply capability of the PWM signal, and outputting the signal. The PWM signals output from the microcomputer or the like are input to the buffer circuit 101 through a terminal IN_H and a terminal IN_L. The signals output from the buffer circuit 101 are the signals to be input to the level shift circuit 102.

In FIG. 4, the PWM signals output from the microcomputer or the like are first signals (denoted as 1st signal in the drawing). Moreover, in FIG. 4, the signals output from the buffer circuit 101 and input to the level shift circuit 102 are second signals (denoted as 2nd signal in the drawing). Note that the PWM signals are stepped up through the buffer circuit 101, the level shift circuit 102, and the buffer circuit 103. The PWM signals stepped up are signals for alternately turning on the transistor 121 and the transistor 122 included in the buffer circuit 104.

Note that although the two signals input from the terminal IN_H and the terminal IN_L are shown in FIG. 4 as examples of the PWM signals, one embodiment of the present invention is not limited thereto. For example, a configuration may be employed in which three or more PMW signals are input to the buffer circuit 101. Note that the two signals input from the terminal IN_H and the terminal IN_L are preferably inverted signals of each other.

The level shift circuit 102 includes a transistor 111, a transistor 112, a capacitor 113, and a capacitor 114. To one electrode of the capacitor 113 and one electrode of the capacitor 114, the output from the buffer circuit 101 is supplied. One of a source and a drain of the transistor 111 is electrically connected to the terminal V2, and the other is electrically connected to a gate of the transistor 112 and the other electrode of the capacitor 113. One of a source and a drain of the transistor 112 is electrically connected to the terminal V2, and the other is electrically connected to a gate of the transistor 111 and the other electrode of the capacitor 114.

The level shift circuit 102 is a circuit having a function of stepping up the voltages of the PWM signals output from the microcomputer or the like on the basis of the second signals output from the buffer circuit 101, and outputting the voltages of the PWM signals. The signals input to the level shift circuit 102 are the signals output from the buffer circuit 101 and supplied to the capacitor 113 and the capacitor 114. The signals output from the buffer circuit 101 are the signals to be input to the level shift circuit 102.

The second signals supplied to the level shift circuit 102 are stepped up by capacitive coupling in the capacitor 113 and the capacitor 114. The second signals stepped up by the capacitive coupling are further stepped up by the voltage applied to the terminal V2 (hereinafter referred to as a voltage v2a) and are output to the buffer circuit 103. In FIG. 4, the signals output from the level shift circuit 102 and input to the buffer circuit 103 are third signals (denoted as 3rd signal in the drawing). Note that the second signal and the third signal are originally the signals supplied to the terminal IN_H and the terminal IN_L.

Each of the transistor 111 and the transistor 112 is a transistor functioning as a switch. Moreover, the transistor 111 and the transistor 112 are transistors having the same polarity. As an example, FIG. 4 shows an example in which n-channel transistors are used as the transistor 111 and the transistor 112.

In the operation of the transistor 111 and the transistor 112, at the timing when one of the second signals input to the capacitor 113 and the capacitor 114 is set to an H level, the transistor whose gate is connected to the capacitor at the H level is turned on. By contrast, at the timing when the other of the second signals input to the capacitor 113 and the capacitor 114 is set to an L level, the transistor whose gate is connected to the capacitor at the L level is turned off. For example, when the second signal input to the capacitor 113 is set to the H level, the transistor 112 is turned on, whereas when the second signal input to the capacitor 114 is set to the L level, the transistor 111 is turned off. When the second signal input to the capacitor 113 is set to the L level, the transistor 112 is turned off, whereas when the second signal input to the capacitor 114 is set to the H level, the transistor 111 is turned on.

In the period during which the transistor 111 is on, a current flows from the terminal V2 to a node N1 at which the capacitor 113 connected to the one of the source and the drain of the transistor 111 and the gate of the transistor 112 which is off are connected to each other, and the node is charged (a first operation).

On the other hand, the transistor 112 operates in an opposite way to the transistor 111. In other words, in the period during which the transistor 112 is on, a current flows from the terminal V2 to a node N2 at which the capacitor 114 connected to the one of the source and the drain of the transistor 112 and the gate of the transistor 111 which is off are connected to each other, and the node is charged (the first operation).

Next, in the period during which the transistor 111 is off, the node at which the capacitor 113 connected to the one of the source and the drain of the transistor 111 and the gate of the transistor 112 are connected to each other is in an electrically floating state. At this time, the capacitor 113 is supplied with the H level. Accordingly, the potential of the node in the electrically floating state is further raised by capacitive coupling. The signal which is stepped up by this capacitive coupling is output to the buffer circuit 103 as the third signal (a second operation).

On the other hand, in the period during which the transistor 112 is off, the node at which the capacitor 114 connected to the one of the source and the drain of the transistor 112 and the gate of the transistor 111 are connected to each other is in an electrically floating state. At this time, the capacitor 114 is supplied with the H level. Accordingly, the potential of the node in the electrically floating state is further raised by capacitive coupling. The signal which is stepped up by this capacitive coupling is output to the buffer circuit 103 as the third signal (the second operation).

By repeating the first operation and the second operation described above, the level shift circuit 102 can output the third signals, which are obtained by stepping up the second signals.

Note that the capacitor 113 and the capacitor 114 are preferably elements in which dielectric breakdown due to a high voltage does not occur. It is preferable that electrostatic capacitances of the capacitor 113 and the capacitor 114 are 5 times or more, preferably 10 times or more the gate capacitance of the buffer circuit 103. Note that in the case where the electrostatic capacitances of the capacitor 113 and the capacitor 114 are set to be large, it is preferable that the buffer circuit 101 convert the second signals into signals with improved electric charge supply capability.

To have large electrostatic capacitances, the capacitor 113 and the capacitor 114 may be provided over a substrate different from the substrate over which the transistors of the semiconductor device are formed.

The electrostatic capacitance of the capacitor 113 may be as large as that of the capacitor 114 or may be different therefrom.

The configuration of the level shift circuit 102 shown in FIG. 4 includes a configuration in which the second signals are supplied to the capacitor 113 and the capacitor 114 using capacitive coupling. This configuration prevents a high voltage from being applied directly between the source and the drain of each of the transistor 111 and the transistor 112 and can thus prevent dielectric breakdown of the transistors. Therefore, the driver circuit for driving the power transistor can operate in a normal state, which can prevent malfunction. Furthermore, a shoot-through current can be prevented from flowing through the level shift circuit 102, resulting in lower power consumption.

The buffer circuit 103 is a circuit having a function of stepping up the third signals output from the level shift circuit 102 to signals that can operate the buffer circuit 104 and/or converting the third signals into signals with improved electric charge supply capability, and outputting the signals. The signals input to the buffer circuit 103 are signals supplied to a gate of a transistor included in the buffer circuit 103. The signals output from the buffer circuit 103 are the signals to be input to the buffer circuit 104.

In FIG. 4, the signals supplied to the gates of the transistors included in the buffer circuit 103 are the third signals. Moreover, in FIG. 4, the signals output from the buffer circuit 103 and input to the buffer circuit 104 are fourth signals (denoted as 4th signal in the drawing). Note that the fourth signals are originally the signals supplied to the terminal IN_H and the terminal IN_L.

Note that although FIG. 4 shows a configuration in which the buffer circuit 103 is provided between the level shift circuit 102 and the buffer circuit 104, a configuration may be employed in which a plurality of buffer circuits are provided. Alternatively, a configuration may be employed in which a delay circuit such as a flip-flop is provided between the level shift circuit 102 and the buffer circuit 104.

The buffer circuit 104 includes the transistor 121 and the transistor 122. The signal output from the buffer circuit 104 is supplied to the power MOSFET provided outside through an output terminal OUT.

The voltage applied to the terminal V1 (hereinafter referred to as a voltage v1a) is a voltage for turning on the power MOSFET connected to the output terminal OUT. The voltage v2a is a voltage for turning off the power transistor connected to the output terminal OUT. The buffer circuit 104 switches, with the voltage from the terminal V1 or the voltage from the terminal V2, the voltage to be output from the output terminal OUT and outputs the voltage in order to control switching of the power MOSFET connected to the output terminal OUT. Note that the voltage v1a is sometimes referred to as a first voltage. The voltage v2a is sometimes referred to as a second voltage. Each of the voltage v1a and the voltage v2a is preferably a voltage generated by step-up using a bootstrap circuit on the basis of a high power supply potential VDD. In the case where the high power supply potential VDD is a higher voltage, each of the voltage v1a and the voltage v2a may be a voltage generated by stepping down the high power supply potential VDD. The voltage v1a and the voltage v2a may each be a voltage directly applied from the outside. Note that the voltage v1a is a voltage higher than the voltage v2a.

The buffer circuit 104 is a circuit having a function of outputting the voltage for switching the conduction and non-conduction of the power transistor on the basis of the fourth signals output from the buffer circuit 103. The signals input to the buffer circuit 104 are each a signal supplied to the gate of the transistor 121 or the transistor 122 included in the buffer circuit 104. The signal output from the buffer circuit 104 is a signal for switching the conduction and non-conduction of the power transistor provided outside and is output through the output terminal OUT. Note that as described above, the fourth signals supplied to the gates of the transistor 121 and the transistor 122 are originally the signals supplied to the terminal IN_H and the terminal IN_L. The fourth signals alternately turn on the transistor 121 and the transistor 122. Therefore, the signal output from the output terminal OUT is the signal output by switching between the voltage v1a and the voltage v2a.

The driver circuit 760a described above has a configuration in which the signals are supplied to the capacitor 113 and the capacitor 114 in the level shift circuit 102 using capacitive coupling. This configuration prevents a high voltage from being applied directly between the source and the drain of each of the transistor 111 and the transistor 112 and can thus prevent dielectric breakdown of the transistors. Therefore, the driver circuit for driving a power device can operate in a normal state, which can prevent malfunction. Furthermore, a shoot-through current can be prevented from flowing through the level shift circuit 102, resulting in lower power consumption. Thus, the reliability of the amplifier 750 can be increased. Furthermore, the power consumption of an amplifier circuit can be reduced. The noise of the signal output from the amplifier 750 can be reduced in some cases.

Next, a specific circuit configuration and a specific operation of the driver circuit 760a shown in FIG. 4 are described with reference to FIG. 5 to FIG. 9.

Figure 5:
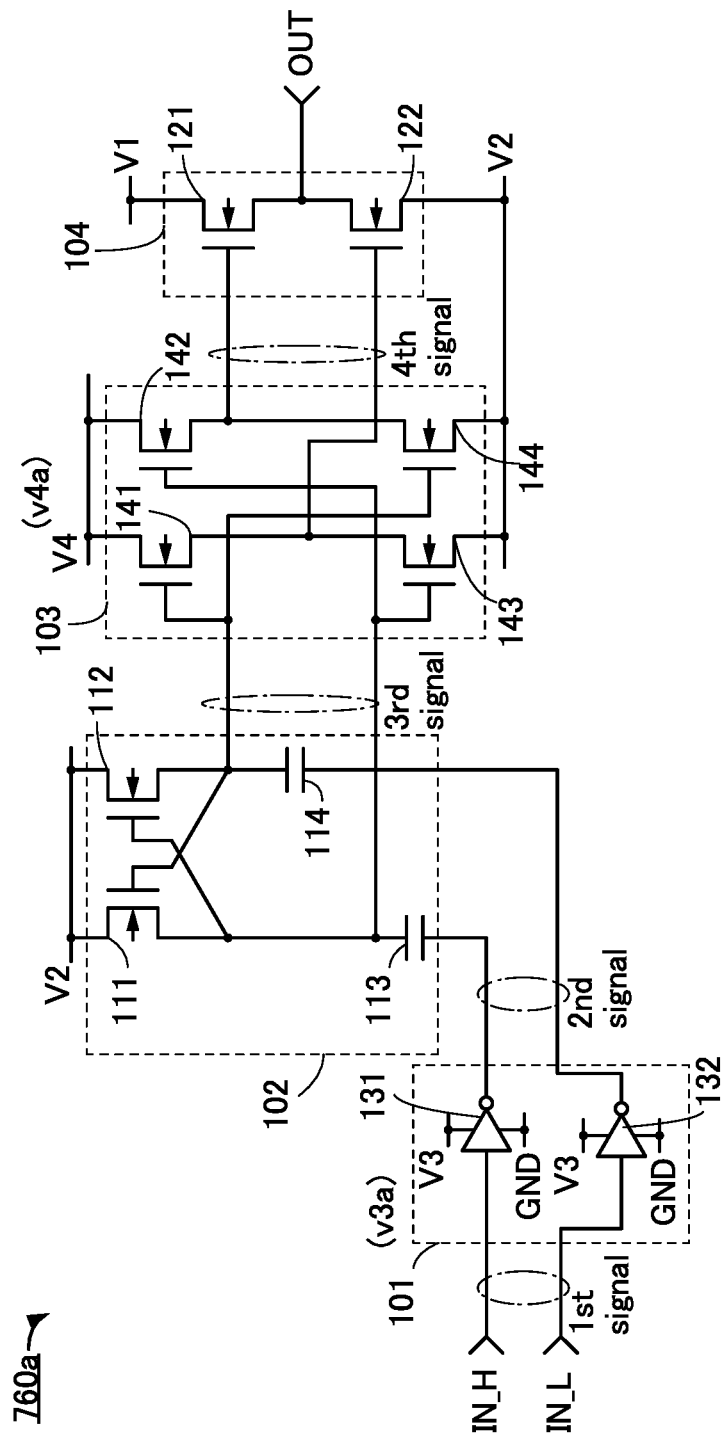
FIG. 5 is a circuit diagram showing a configuration of a circuit of one embodiment of the present invention.

FIG. 5 is a diagram showing a specific example of a circuit configuration for the circuit diagram of the driver circuit shown in FIG. 4.

The buffer circuit 101 shown in FIG. 5 includes an inverter circuit 131 and an inverter circuit 132. The inverter circuit 131 and the inverter circuit 132 are each supplied with potentials from a terminal V3 and a terminal GND. The terminal GND is supplied with the ground potential. Moreover, the inverter circuit 131 and the inverter circuit 132 include transistors having the same polarity as the transistor 111 and the transistor 112 included in the level shift circuit 102.

Figure 6A:
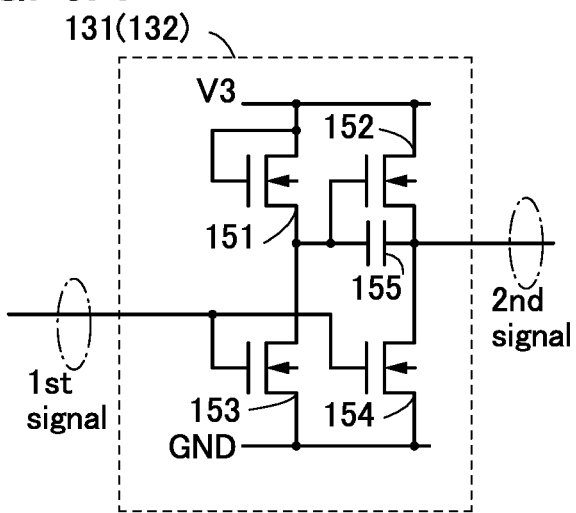
FIG. 6A is a circuit diagram showing a configuration of a circuit of one embodiment of the present invention.

Here, FIG. 6A shows an example of the circuit configuration of the inverter circuit 131 and the inverter circuit 132 each including n-channel transistors as the transistors having the same polarity.

The inverter circuit 131 (or the inverter circuit 132) shown in FIG. 6A includes a transistor 151, a transistor 152, a transistor 153, a transistor 154, and a capacitor 155. Like the transistor 111 and the transistor 112 shown in each of FIG. 4 and FIG. 5, the transistor 151, the transistor 152, the transistor 153, and the transistor 154 are shown as n-channel transistors.

To the terminal V3 is applied a voltage for allowing the level shift circuit 102 to perform step-up through charging and discharging of electric charge in the capacitor 113 and the capacitor 114. The wiring connected to the terminal V3 preferably has high electric charge supply capability so that charging and discharging of electric charge in the capacitor 113 and the capacitor 114 can be performed at high speed. Note that the voltage applied to the terminal V3 (hereinafter referred to as a voltage v3a) is sometimes referred to as a third voltage. The voltage v3a is preferably a voltage generated by step-up using a bootstrap circuit on the basis of the high power supply potential VDD. In the case where the high power supply potential VDD is a higher voltage, the voltage v3a may be a voltage generated by stepping down the high power supply potential VDD internally. The voltage v3a may be a voltage directly applied from the outside. The voltage v3a is a voltage lower than the voltage v1a and the voltage v2a.

One of source and drain terminals of each of the transistor 151 and the transistor 152 is connected to the terminal V3. One of source and drain terminals of each of the transistor 153 and the transistor 154 is connected to the terminal GND. The capacitor 155 is provided between a gate of the transistor 152 and the other of the source and drain terminals thereof. The inverter circuit 131 (or the inverter circuit 132) shown in FIG. 6A is a circuit that can output, as the second signal, a signal with the inverted logic of the first signal.

Figure 6B:
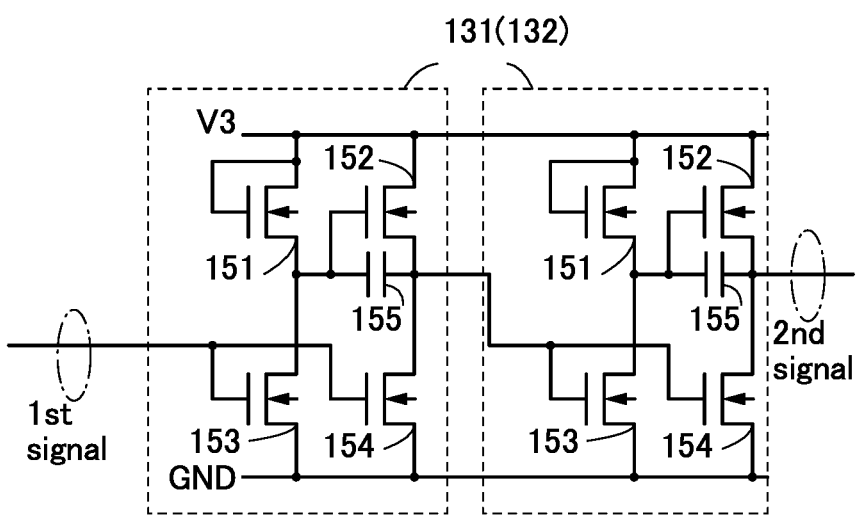
FIG. 6B is a circuit diagram showing a configuration of the circuit of one embodiment of the present invention.

As shown in FIG. 6B, the inverter circuits 131 (or the inverter circuits 132) shown in FIG. 6A may be electrically arranged in series to output the second signal with the original logic of the first signal that is obtained by re-inversion.

The configuration of the level shift circuit 102 shown in FIG. 5 is similar to that of the level shift circuit 102 illustrated in FIG. 4. In FIG. 5, the transistor 111 and the transistor 112 of the level shift circuit 102 are shown as n-channel transistors as in FIG. 4.

The buffer circuit 103 shown in FIG. 5 includes a transistor 141, a transistor 142, a transistor 143, and a transistor 144. The buffer circuit 103 is connected to a terminal V4 and the terminal V2. The buffer circuit 103 outputs, as the fourth signals obtained by switching between the voltage applied to the terminal V4 (hereinafter referred to as a voltage v4a) and the voltage v2a on the basis of the third signals, the signals to be applied to the gates of the transistor 121 and the transistor 122 of the buffer circuit 104. Like the transistor 111 and the transistor 112 shown in each of FIG. 4 and FIG. 5, the transistor 141, the transistor 142, the transistor 143, and the transistor 144 are shown as n-channel transistors.

Note that the voltage v4a is a voltage for further stepping up the third signals so that the transistor 121 and the transistor 122 can be reliably turned on. This step-up is performed to prevent the transistor 121 and the transistor 122 from failing to be turned on in the case where, for example, the third signals output through the transistor 111 and the transistor 112 have the voltages lowered by the threshold voltages of the transistors. Note that the voltage v4a is sometimes referred to as a fourth voltage. The voltage v4a is preferably a voltage generated by step-up using a bootstrap circuit on the basis of the high power supply potential VDD. In the case where the high power supply potential VDD is a higher voltage, the voltage v4a may be a voltage generated by stepping down the high power supply potential VDD internally. The voltage v4a may be a voltage directly applied from the outside. The voltage v4a is a voltage equal to or higher than the voltage v1a.

Figure 7:
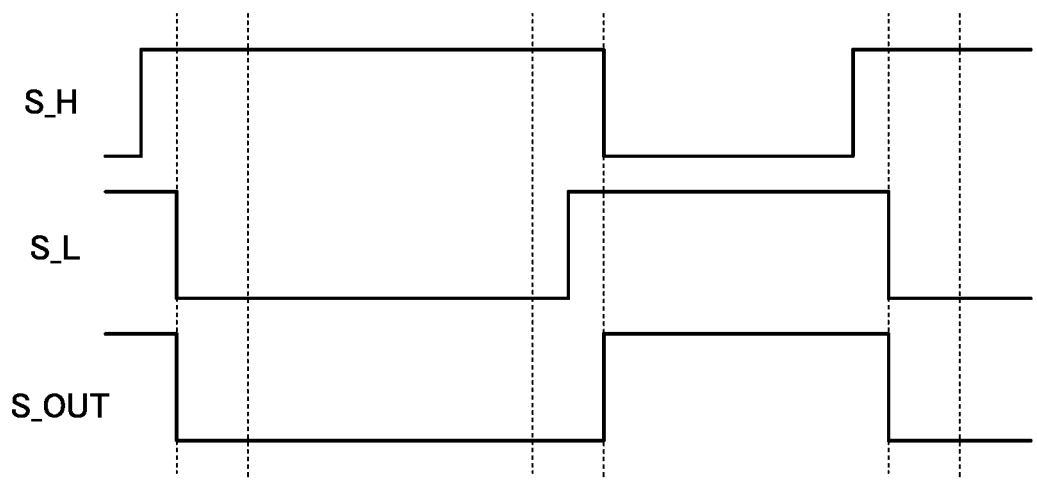
FIG. 7 is a timing chart for illustrating an operation of a circuit of one embodiment of the present invention.

FIG. 7 is a timing chart showing an operation of the circuit of one embodiment of the present invention. The PWM signal supplied to the terminal IN_H shown in FIG. 5 is a PWM signal S_H, and the PWM signal supplied to the terminal IN_L is a PWM signal S_L. The output signal supplied to the output terminal OUT is an output signal S_OUT. The PWM signal S_H, the PWM signal S_L, and the output signal S_OUT can be expressed as in the timing chart shown in FIG. 7. Note that although the scales of the voltages of the PWM signal S_H, the PWM signal S_L, and the output signal S_OUT are shown with the same amplitude voltage, the amplitude voltage of the output signal S_OUT is actually lower than those of the PWM signal S_H and the PWM signal S_L. Note that the potentials amplified by the PWM signal S_H and the PWM signal S_L are stepped up by the above-described buffer circuit 101, level shift circuit 102, and buffer circuit 103 to be the voltages for controlling the conduction or non-conduction of the transistor 121 and the transistor 122 of the buffer circuit 104. Then, in the driver circuit 760a, the output signal S_OUT for outputting either a voltage V1 or a voltage V2 can be output in accordance with the PWM signal S_H and the PWM signal S_L that are stepped up.

In the configuration of the driver circuit 760a shown in FIG. 5, the voltage of the wiring supplying a low power supply potential in the buffer circuit 101 can be different from the voltage of the wirings supplying a low power supply potential in the buffer circuit 103 and the buffer circuit 104. Specifically, the voltage of the wiring supplying the low power supply potential in the buffer circuit 101 can be the ground potential, and the voltage of the wirings supplying the low power supply potential in the buffer circuit 103 and the buffer circuit 104 can be the voltage of the terminal V2. Therefore, malfunction can be reduced which occurs in the case where a current due to a reactance component which is accumulated in the wirings flows through the terminal IN_H and the terminal IN_L supplied with the PWM signals when such a current flows through the driver circuit 760a.

The transistor 111 and the transistor 112, the transistor 121 and the transistor 122, the transistor 141 to the transistor 144, and the transistor 151 to the transistor 154 described with reference to FIG. 5, FIG. 6A, and FIG. 6B are n-channel transistors. That is, the buffer circuit 101, the buffer circuit 103, the buffer circuit 104, and the level shift circuit 102 of the semiconductor device can be configured by transistors having a single polarity.

In the case where the semiconductor device is configured by transistors having a single polarity, the number of photomasks for separately forming an n-channel transistor and a p-channel transistor can be reduced as compared to that in the case where the driver circuit is configured by complementary transistors. Therefore, the manufacturing cost can be reduced with the configuration of the present invention.

In the case of configuring a semiconductor device for converting a PWM signal into a high-voltage signal only by replacing the transistors configuring the semiconductor device with transistors having a single polarity, the dielectric breakdown of the transistors might occur because of a high voltage used to convert the signal. On the other hand, the semiconductor device with the configuration of this embodiment has a configuration in which the signals are supplied to the capacitor 113 and the capacitor 114 in the level shift circuit 102 using capacitive coupling. This configuration prevents a high voltage from being applied directly between the source and the drain of each of the transistor 111 and the transistor 112 and can thus prevent dielectric breakdown of the transistors. Therefore, the driver circuit for driving a power device can operate in a normal state, which can prevent malfunction.

Moreover, in the semiconductor device having the configuration of this embodiment, the semiconductor device is configured by the transistors having a single polarity, so that the transistors can be formed using a semiconductor material other than silicon in their semiconductor layers. The transistors can be formed using an oxide semiconductor in their semiconductor layers, for example.

An oxide semiconductor has a larger energy gap than silicon, and in an oxide semiconductor, the number of carriers generated by thermal excitation can be extremely small. Therefore, the characteristics of a transistor including an oxide semiconductor in its semiconductor layer do not deteriorate even in a high-temperature environment, so that a change in electrical characteristics can be kept small.

Specifically, the oxide semiconductor is preferably a highly purified oxide semiconductor (purified OS) obtained by a reduction of impurities such as moisture or hydrogen serving as electron donors (donors) and a reduction of oxygen vacancies. The highly purified oxide semiconductor is an i-type oxide semiconductor (an intrinsic semiconductor) or a substantially i-type oxide semiconductor. For this reason, a transistor including a channel formation region in a highly purified oxide semiconductor layer has an extremely low off-state current and is highly reliable in a high-temperature environment. The transistor including an oxide semiconductor, which has such characteristics, is suitable for the transistor used in the semiconductor device of this embodiment.

The driver circuit 760a described above is configured by the transistors having a single polarity. With this configuration, the transistors including an oxide semiconductor can be used as the transistors configuring the driver circuit 760a. With this configuration, the transistors configuring the driver circuit 760a can be transistors with an extremely low off-state current and improved reliability in a high-temperature environment. Therefore, it is possible to prevent malfunction of the transistors configuring the driver circuit 760a due to a temperature change. Furthermore, it is possible to eliminate limitation on arrangement of the driver circuit 760a, such as preliminarily providing the power transistor and the driver circuit such that they are apart from each other or providing a cooling unit to prevent the driver circuit 760a from being in a high-temperature state.

Figure 8A:
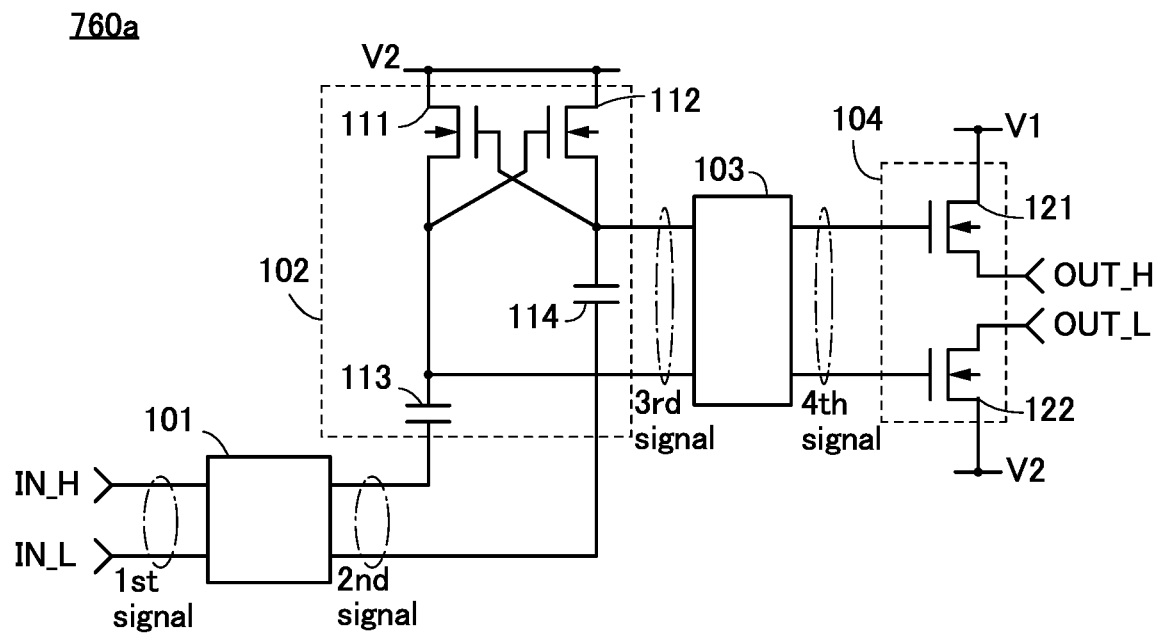
FIG. 8A is a circuit diagram showing a configuration of a circuit of one embodiment of the present invention.

In the configuration of the driver circuit 760a shown in FIG. 5, the output terminal OUT can be divided into two output terminals, an output terminal OUT_H and an output terminal OUT_L as shown in FIG. 8A. When the output terminal is divided into the two output terminals, the output terminal OUT_H and the output terminal OUT_L, as shown in FIG. 8A, a shoot-through current flowing between the terminal V1 and the terminal V2 can be reduced.

Figure 8B:
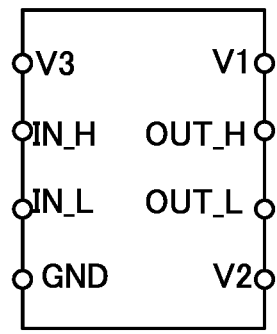
FIG. 8B is a block diagram showing a configuration of the circuit of one embodiment of the present invention.

The driver circuit 760a shown in FIG. 8A can be expressed as in FIG. 8B by being simply shown by a block diagram.

Figure 9:
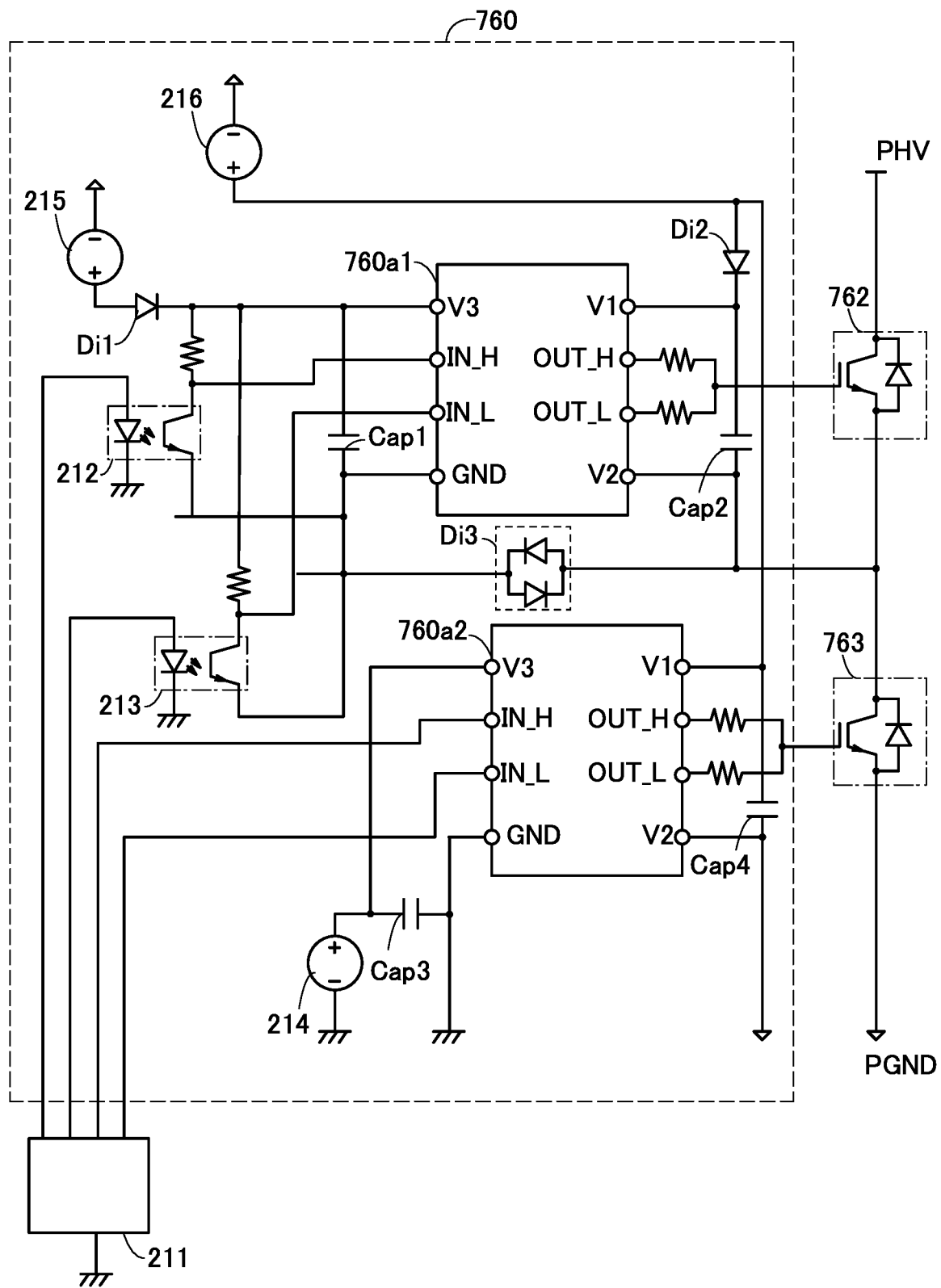
FIG. 9 is a circuit diagram showing a configuration of a circuit of one embodiment of the present invention.

Next, FIG. 9 shows an application example of a semiconductor device that is a low side driver for driving the power transistor with reference to the block diagram in FIG. 8B.

As an example of the gate driver 760, FIG. 9 shows a low side driver that includes the driver circuit 760a in FIG. 8A.

FIG. 9 also shows the transistor 762 and the transistor 763 that are the power MOSFETs supplied with the output from the gate driver 760. FIG. 9 also shows a control circuit 211 that supplies signals or the like to the gate driver 760.

The gate driver 760 shown in FIG. 9 includes two driver circuits 760a (hereinafter referred to as a driver circuit 760a1 and a driver circuit 760a2). The configuration shown in FIG. 9 includes the control circuit 211, a photocoupler 212, a photocoupler 213, reference voltage generation circuits 214 to 216, diodes Di1 to Di3, capacitors Cap1 to Cap4, the transistor 762, and the transistor 763. Note that in the circuit diagram shown in FIG. 9, resistors provided on wirings are elements provided to convert a flowing current into a voltage. In the circuit diagram shown in FIG. 9, a voltage PHV and a voltage PGND are voltages to be applied to loads (not shown) connected to the transistor 762 and the transistor 763.

As the control circuit 211, for example, the power supply control circuit 761 shown in FIG. 2 can be used.

To the driver circuit 760a1 and the driver circuit 760a2, the PWM signals output from the control circuit 211 are supplied through the photocoupler 212 and the photocoupler 213 or wirings. In the driver circuit 760a1, the voltages from the reference voltage generation circuits 214 to 216 are applied to the terminals V1, V2, and V3. Note that for the voltage v4a, the voltages obtained by stepping up the voltages output from the reference voltage generation circuits 214, 215, and 216 with the use of the diodes Di1 and Di2 and the capacitors Cap1 and Cap2 are applied to the driver circuit 760a1.

Note that in the configuration of the low-side driver shown in FIG. 9, the diode Di3 is provided between the terminal GND and the terminal V2 of the driver circuit 760a1 so that a current flows in both directions. The diode Di3 is an element provided as needed in order to cause a short circuit, which prevents a large potential difference between the terminals so that malfunction would not occur in the case where the difference between the voltages applied to the terminal GND and the terminal V2 is largely changed.

In the driver circuit described in this embodiment, the buffer circuits and the level shift circuit are configured by the transistors having the same polarity. Therefore, the transistors provided in the driver circuit can be transistors having a single polarity.

Furthermore, the driver circuit has a configuration in which a capacitor is provided in the level shift circuit, and a signal to be stepped up through the capacitor is supplied and is stepped up using capacitive coupling in the capacitor. With this configuration, the voltage applied between the source and the drain of the transistor in the level shift circuit can be made lower than the voltage applied to the capacitor in the level shift circuit, so that dielectric breakdown of the transistor can be inhibited.

This embodiment can be implemented in appropriate combination with any of the other embodiments.

Embodiment 3

This embodiment will describe a configuration example of a comparator of one embodiment of the present invention.

Figure 10:
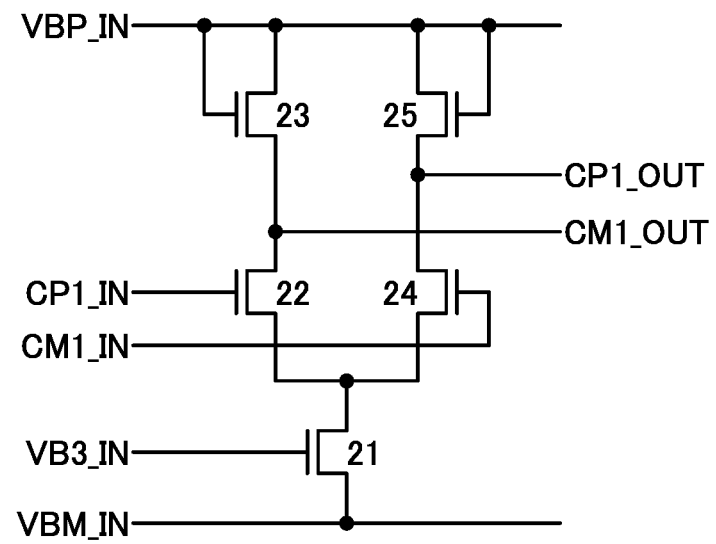
FIG. 10 is a circuit diagram illustrating one embodiment of the present invention.

FIG. 10 illustrates an example of the configuration of a comparator 50 that can be used as the comparator included in the amplifier described in the above embodiment. The comparator 50 includes a transistor 21 to a transistor 25. The comparator 50 also includes a wiring VBM_IN supplied with a first potential, a wiring VBP_IN supplied with a second potential, a wiring VB3_IN supplied with a predetermined potential VB3, an input terminal CP1_IN, an input terminal CM1_IN, an output terminal CP1_OUT, and an output terminal CM1_OUT.

Here, the predetermined potential VB3 is higher than the second potential. In the comparator 50, the second potential is a high power supply potential and the first potential is a low power supply potential.

In the comparator 50, one of a source and a drain of the transistor 21 is electrically connected to the wiring VBM_IN; the other of the source and the drain of the transistor 21 is electrically connected to one of a source and a drain of the transistor 22 and one of a source and a drain of the transistor 24; and a gate of the transistor 21 is electrically connected to the wiring VB3_IN.

The other of the source and the drain of the transistor 22 is electrically connected to one of a source and a drain of the transistor 23 and the output terminal CM1_OUT; the other of the source and the drain of the transistor 23 and a gate of the transistor 23 are electrically connected to the wiring VBP_IN; and a gate of the transistor 22 is electrically connected to the input terminal CP1_IN.

The other of the source and the drain of the transistor 24 is electrically connected to one of a source and a drain of the transistor 25 and the output terminal CP1_OUT; the other of the source and the drain of the transistor 25 and a gate of the transistor 25 are electrically connected to the wiring VBP_IN; and a gate of the transistor 24 is electrically connected to the input terminal CM1_IN.

A plurality of the circuits shown in FIG. 10 may be connected in parallel and used as the comparator 50. That is, the output of the comparator shown in FIG. 10 may be input to a next-stage comparator 50, and a plurality of comparators may be connected and used.

This embodiment can be combined with the description of the other embodiments as appropriate.

Embodiment 4

A structure example of a semiconductor device applicable to the amplifier described in the above embodiment will be described.

Figure 11:
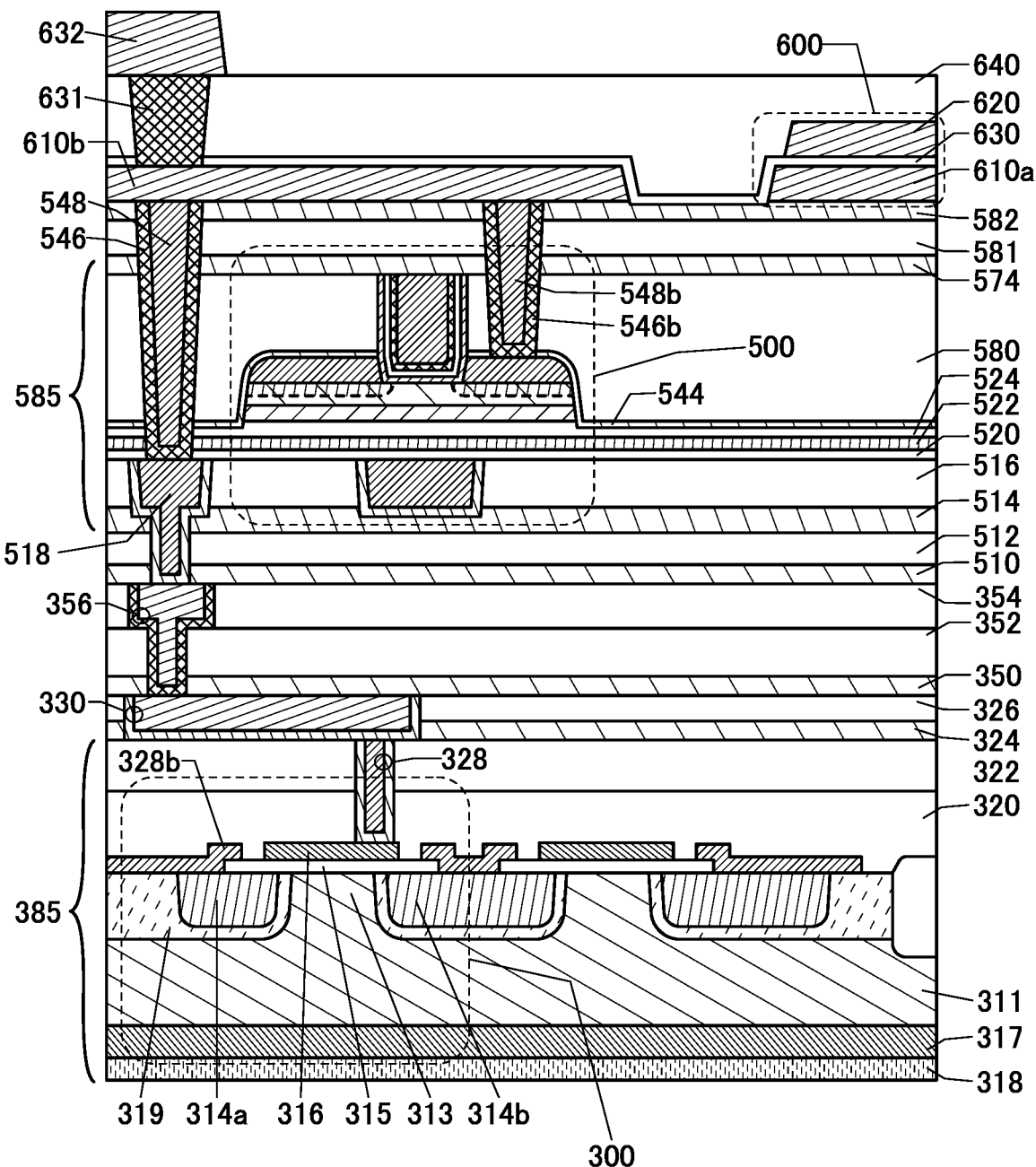
FIG. 11 is a cross-sectional view showing a structure example of a semiconductor device.

A semiconductor device illustrated in FIG. 11 includes a transistor 300, a transistor 500, and a capacitor 600. Note that in the example illustrated in FIG. 11, the semiconductor device includes a plurality of transistors 300.

Figure 14A:
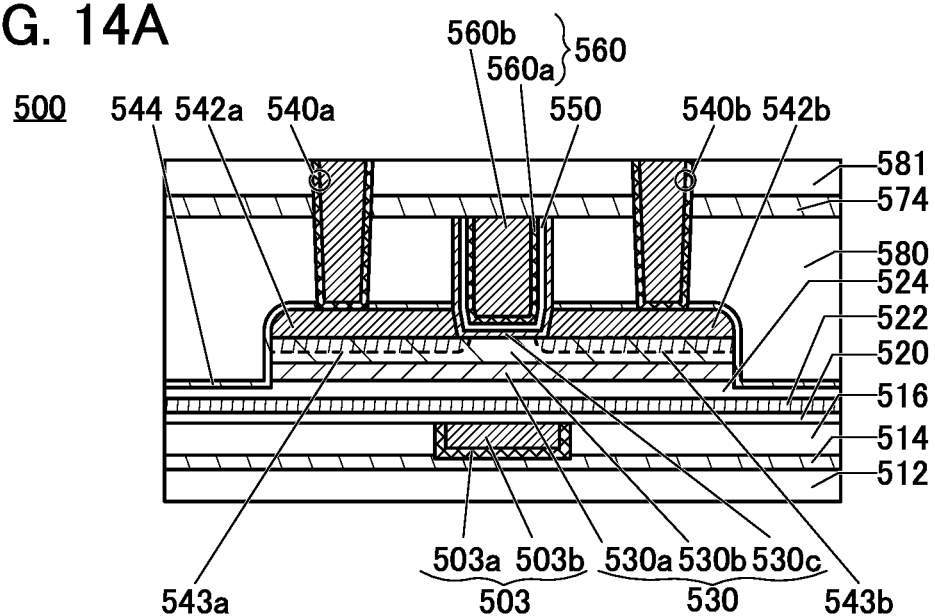
FIG. 14A is a cross-sectional view showing a structure example of a transistor.
Figure 14B:
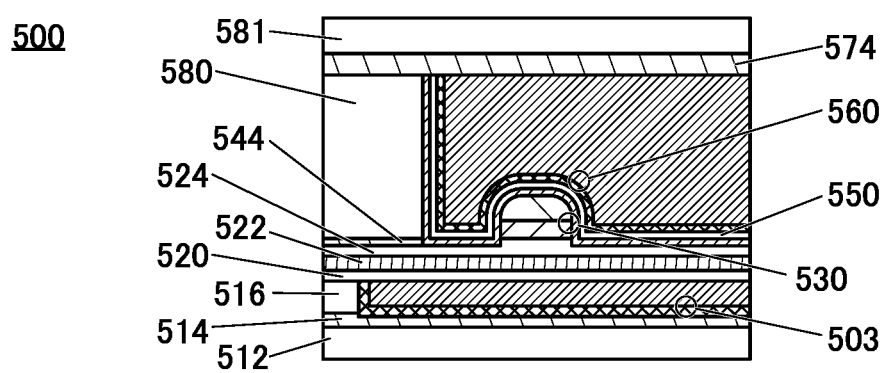
FIG. 14B is a cross-sectional view showing the structure example of the transistor.

FIG. 14A is a cross-sectional view of the transistor 500 in the channel length direction, and FIG. 14B is a cross-sectional view of the transistor 500 in the channel width direction.

The transistor 500 is an OS transistor. Since the off-state current of the transistor 500 is low, the use of the transistor 500 as a transistor included in a semiconductor device enables the semiconductor device to retain written data for a long term.

The transistor 500 is an n-channel transistor, for example.

Here, the transistor shown as the transistor 500 can be used to form the gate driver 760 and the power supply control circuit 761 in the semiconductor device 751 included in the amplifier 750 described in the above embodiment. In addition, the transistor shown as the transistor 300 can be used as at least one of the transistor 762 and the transistor 763.

As shown in FIG. 11, the transistor 500 and the transistor 300 can be stacked. Thus, in the case where the transistor 300 in FIG. 11 is used as the transistor 762 (or the transistor 763), for example, the gate driver 760, the power supply control circuit 761, and other components of the semiconductor device 751 can be formed using the transistor 500 and stacked and provided over the transistor 762 (or the transistor 763). Note that only part of these circuits may be stacked and provided over the transistor 300.

The semiconductor device described in this embodiment includes the transistor 300, the transistor 500, and the capacitor 600 as illustrated in FIG. 11. The transistor 500 is provided above the transistor 300, and the capacitor 600 is provided above the transistor 300 and the transistor 500. A layer 385 is a layer where the transistor 300 is provided. In FIG. 11, for example, the layer 385 includes a substrate 311 and layers positioned between the substrate 311 and an insulator 322. A layer 585 is a layer where the transistor 500 is provided. In FIG. 11, for example, the layer 585 includes layers positioned between an insulator 514 and an insulator 574. The substrate 311, the insulator 322, the insulator 514, and the insulator 574 will be described later.

The capacitor 600 shown in FIG. 11 can be used as the capacitor included in the amplifier 750 described in the above embodiment. For example, the capacitor 600 can be used as the capacitors included in the gate driver 760 and the power supply control circuit 761.

The transistor 300 is provided on the substrate 311 and includes a conductor 316, an insulator 315, a semiconductor region 313 that is part of the substrate 311, and a diffusion layer 314*a* and a diffusion layer 314*b* functioning as a source region and a drain region. The conductor 316 can function as a gate of the transistor 300. The insulator 315 can function as a gate insulating film of the transistor 300. The diffusion layer 314*a* and the diffusion layer 314*b* are low-resistance regions, for example.

Note that the transistor 300 can be used as the transistor 762 and the transistor 763 described in the above embodiment, for example.

Figure 12:
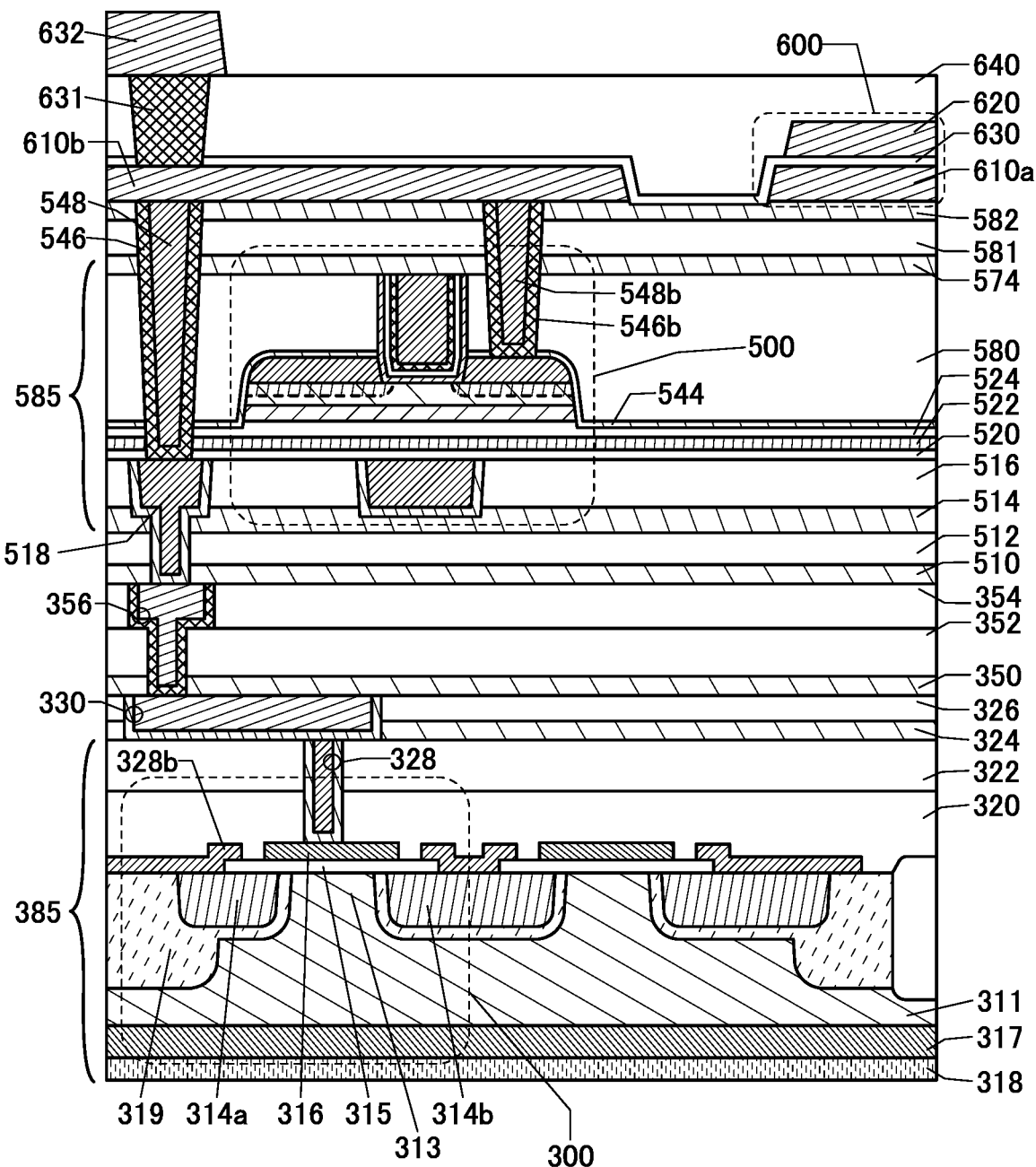
FIG. 12 is a cross-sectional view showing a structure example of a semiconductor device.

FIG. 12 is different from FIG. 11 in the structure of the transistor 300. The transistor 300 shown in FIG. 12 is provided such that part of a region 319 is formed deeply. The region 319 will be described later.

The transistor 300 illustrated in FIG. 11 and FIG. 12 is a transistor having a planar structure.

Figure 13:
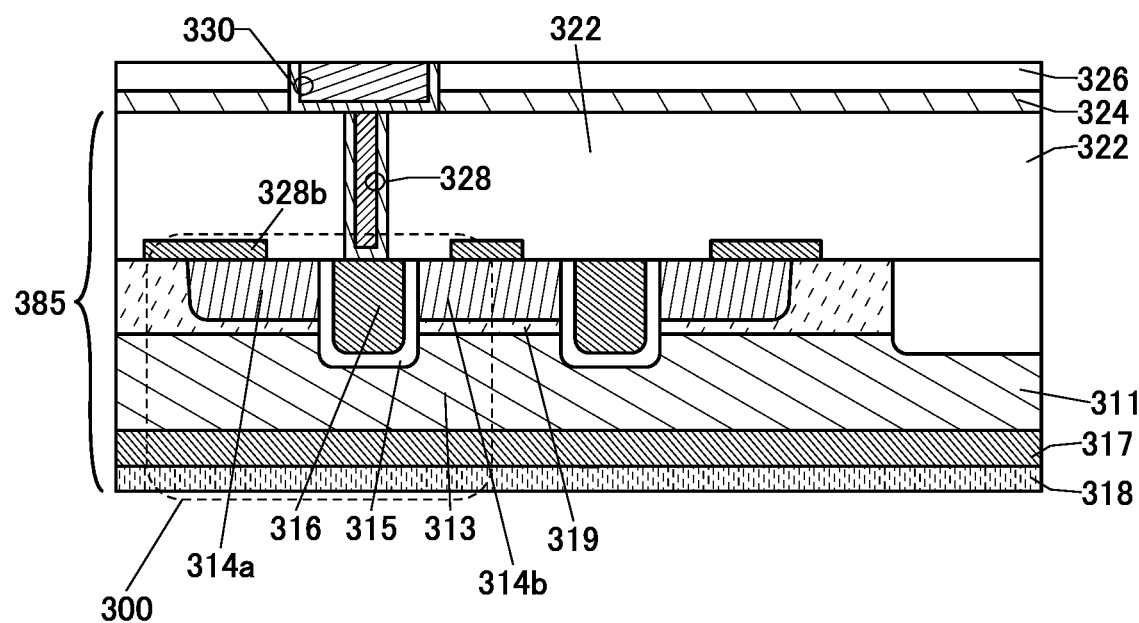
FIG. 13 is a cross-sectional view showing a structure example of a transistor.

FIG. 13 shows an example of the transistor 300 having a trench structure.

The transistor 300 shown in each of FIG. 11, FIG. 12, and FIG. 13 as an example can be suitably used as a power MOSFET, and it is particularly preferable that the transistor 300 be used as the transistor 762 or the transistor 763. The transistor 300 illustrated in each of FIG. 11, FIG. 12, and FIG. 13 is sometimes referred to as a D-MOS (Double Diffusion Metal Oxide Semiconductor) FET.

The transistor 300 illustrated in FIG. 11 is a transistor having a planar structure. The transistor 300 can operate as a MOSFET when the diffusion layer 314*a* and the diffusion layer 314*b* are used as a source region and a drain region; here, both the diffusion layer 314*a* and the diffusion layer 314*b* function as a source, the region 319 is formed outside the diffusion layer 314*a* and the diffusion layer 314*b*, and a diffusion layer 317 functioning as a drain is provided in a region below the semiconductor region 313 in the silicon substrate in the cross section of FIG. 11, so that the transistor 300 can function as a D-MOSFET.

A rear electrode 318 can be provided below the diffusion layer 317 to function as a drain electrode. Both the diffusion layer 314*a* and the diffusion layer 314*b* may function as a drain, and the diffusion layer 317 may function as a source.

The region 319 preferably has a polarity opposite to that of the diffusion layer 314*a* and the diffusion layer 314*b*. For example, in the case where the diffusion layer 314*a* and the diffusion layer 314*b* are n-type regions, the region 319 is preferably a p-type region. Alternatively, the region 319 may be a high-resistance region. The region 319 is an intrinsic region in some cases. The diffusion layer 314*a* and the diffusion layer 314*b* are in contact with the region 319 having the opposite polarity, so that a pn junction is formed. Such a pn junction region is sometimes referred to as a parasitic diode in this specification and the like. The parasitic diode has functions of backflow prevention, rectification, and the like. The parasitic diode also has a function of protecting a transistor. The parasitic diode is formed between the diffusion layer 314*a* and the diffusion layer 314*b* and the diffusion layer 317, so that electric field concentration at the time of applying a high voltage between the source and the drain is reduced, for example, and breakage or deterioration of the transistor can be inhibited.

A conductor 328*b* is preferably provided on top surfaces of the diffusion layer 314*a* and the diffusion layer 314*b*. The conductor 328*b* is also preferably provided on a top surface of the region 319.

Note that the diffusion layer 314*a*, the diffusion layer 314*b*, and the diffusion layer 317 are not provided in some cases. Even when these diffusion layers are not provided, the conductor 328*b*, the rear electrode 318, and the like are provided to be connected to the semiconductor region 313 and the like in the substrate 311, so that these electrodes function as a source electrode, a drain electrode, and the like in some cases.

Here, before the rear electrode is provided, the substrate 311 is preferably polished. For example, by polishing the substrate 311, a natural oxide film or the like on a surface of the substrate 311 is removed, which can suppress an increase in resistance. Furthermore, the substrate 311 is preferably polished to have a small thickness. For example, the thickness of the substrate 311 is preferably greater than or equal to 5 μm and less than or equal to 300 μm, further preferably greater than or equal to 10 μm and less than or equal to 150 μm. By making the thickness of the substrate 311 small, the distance between the source and the drain of the transistor 300 can be short, so that the on-state current of the transistor can be increased.

Here, in the case where the substrate 311 is polished to be thin, a support substrate is preferably provided on the opposite side, specifically, over a conductor 632 and an insulator 640, for example. A resin substrate or the like can be used as the support substrate, for example. Alternatively, a substrate including an adhesive layer may be used as the support substrate. As the adhesive layer, an attachable and detachable adhesive may be used. In such a case, when the substrate 311 is polished, a first support substrate is adhered with an adhesive layer; after the polishing, the rear electrode 318 is formed; a second support substrate is provided on a side opposite to the first support substrate side to cover the rear electrode 318; and the first support substrate is removed, and then the conductor 632 is exposed. Then, the conductor 632 is connected by a bump, wire bonding, clip bonding using a conductive clip, or the like.

Note that the transistor 300 can be either a p-channel transistor or an n-channel transistor.

A region of the semiconductor region 313 where a channel is formed, a region in the vicinity thereof, the diffusion layer 314*a* and the diffusion layer 314*b* each functioning as a source region or a drain region, the diffusion layer 317, and the like preferably contain a semiconductor such as a silicon-based semiconductor, and preferably contain single crystal silicon. Alternatively, the regions may be formed with a material containing Ge (germanium), SiGe (silicon-germanium), GaAs (gallium arsenide), GaAlAs (gallium aluminum arsenide), InP (indium phosphide), SiC (silicon carbide), ZnSe (zinc selenide), GaN (gallium nitride), GaO$_x$ (gallium oxide; x is a real number greater than 0), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The diffusion layer 314a, the diffusion layer 314b, and the diffusion layer 317 contain an element that imparts n-type conductivity, such as arsenic or phosphorus, or an element that imparts p-type conductivity, such as boron, in addition to a semiconductor material used for the semiconductor region 313.

For the conductor 316 functioning as the gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of the conductor depends on the material for the conductor, the threshold voltage of the transistor can be adjusted by selecting the material for the conductor. Specifically, it is preferable to use a material such as titanium nitride or tantalum nitride for the conductor. Moreover, in order to ensure both conductivity and embeddability, it is preferable to use stacked layers of a metal material such as tungsten or aluminum for the conductor, and it is particularly preferable to use tungsten in terms of heat resistance.

Note that the transistor 300 illustrated in FIG. 11 is an example and the structure is not limited thereto; an appropriate transistor can be used in accordance with a circuit configuration and a driving method. For example, when the semiconductor device is composed of only OS transistors, the transistor 300 has a structure similar to that of the transistor 500 using an oxide semiconductor. Note that the details of the transistor 500 will be described later.

An insulator 320, the insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has an oxygen content higher than a nitrogen content, and silicon nitride oxide refers to a material that has a nitrogen content higher than an oxygen content. Moreover, in this specification, aluminum oxynitride refers to a material that has an oxygen content higher than a nitrogen content, and aluminum nitride oxide refers to a material that has a nitrogen content higher than an oxygen content.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen and impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. In the example illustrated in FIG. 11, the conductor 328 is provided to be embedded in the insulator 320 and the insulator 322, and the conductor 330 is provided to be embedded in the insulator 324 and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

Here, in the case where semiconductor elements, a semiconductor element and a conductor, or conductors are connected to each other through a plug or a wiring, electrical connection therebetween is obtained, for example.

As a material for each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

In the semiconductor device illustrated in FIG. 11, the conductor 328b is provided over the diffusion layer 314a, the diffusion layer 314b, and the like. The insulator 315 includes a region sandwiched between the diffusion layer 314a and the conductor 328b and a region sandwiched between the diffusion layer 314b and the conductor 328b in some cases. The conductor 328 is provided over the conductor 328b. The conductor 328b includes a region sandwiched between the diffusion layer 314a and the conductor 328 or a region sandwiched between the diffusion layer 314b and the conductor 328 in some cases.

As illustrated in FIG. 12, part of the region 319 may be provided to be formed deeply.

FIG. 11 and FIG. 12 illustrate examples where the transistor 300 is a D-MOSFET with a planar structure; FIG. 13 illustrates an example where the transistor 300 is a D-MOSFET with a trench structure. In FIG. 13, the conductor 316 functioning as the gate is formed in a trench provided between the diffusion layer 314a and the diffusion layer 314b. The insulator 315 functioning as the gate insulator is formed between the conductor 316 and each of the diffusion layer 314a and the diffusion layer 314b.

With the trench structure, the area of an integrated circuit is reduced preferably to 0.5 times or less, further preferably to 0.4 times or less, that of the case where the planar structure is employed.

A wiring layer may be provided over the insulator 326 and the conductor 330. For example, in FIG. 11, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by a barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of the wiring is maintained. In that case, a structure is preferable in which a tantalum nitride layer having a barrier property against hydrogen is in contact with the insulator 350 having a barrier property against hydrogen.

In the above, the wiring layer including the conductor 356 is described; however, the semiconductor device of this embodiment is not limited thereto. A plurality of wiring layers which are similar to the wiring layer including the conductor 356 may be formed.

An insulator 510, an insulator 512, the insulator 514, and an insulator 516 are stacked in this order over the insulator 354. A substance having a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Thus, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, a parasitic capacitance generated between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to a conductor 610b, the transistor 300, or the capacitor 600. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

As illustrated in FIG. 14A and FIG. 14B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom surface and a side surface of the opening, an insulator 550 positioned on a formation surface of the oxide 530c, and a conductor 560 positioned on a formation surface of the insulator 550.

As illustrated in FIG. 14A and FIG. 14B, an insulator 544 is preferably provided between the insulator 580 and the oxide 530a, the oxide 530b, the conductor 542a, and the conductor 542b. In addition, as illustrated in FIG. 14A and FIG. 14B, the conductor 560 preferably includes a conductor 560a provided inside the insulator 550 and a conductor 560b provided to be embedded inside the conductor 560a. As illustrated in FIG. 14A and FIG. 14B, the insulator 574 is preferably positioned over the insulator 580, the conductor 560, and the insulator 550.

Note that in the following description, the oxide 530a, the oxide 530b, and the oxide 530c are sometimes collectively referred to as an oxide 530.

The transistor 500 has a structure in which the three layers of the oxide 530a, the oxide 530b, and the oxide 530c are stacked in the region where a channel is formed and its vicinity; however, the present invention is not limited to this. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 11 and FIG. 14A is an example, and the structure is not limited thereto; an appropriate transistor can be used in accordance with a circuit configuration and a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, a parasitic capacitance formed between the conductor 560 and each of the conductor 542a and the conductor 542b can be reduced. As a result, the switching speed of the transistor 500 can be increased, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover a channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of an opening in the insulator 514 and the insulator 516, and a conductor 503b is formed on the inner side. Although the transistor 500 in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In the case where the conductor 503 also functions as a wiring, a conductive material that has high conductivity and contains tungsten, copper, or aluminum as its main component is preferably used for the conductor 503b. In that case, the conductor 503a is not necessarily provided. Note that the conductor 503b is shown as a single layer but may have a stacked-layer structure and may be a stack of the above conductive material and titanium or titanium nitride, for example.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

The insulator 522 preferably has a function of inhibiting diffusion of oxygen or impurities, in which case oxygen contained in the oxide 530 is not diffused to the insulator 520 side. Furthermore, the reaction of the conductor 503 with oxygen included in the insulator 524 and the oxide 530 can be inhibited.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba, Sr)$TiO_3$ (BST). As miniaturization and high integration of transistors progress, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high dielectric constant can be obtained.

Note that in the transistor 500 in FIG. 14A and FIG. 14B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 1:1:1 [atomic ratio] is used. As the oxide 530c, a metal oxide having In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

The oxide 530b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. Oxygen extraction from the oxide 530b can be inhibited even when heat treatment is performed; thus, the transistor 500 is stable with respect to high temperatures in the manufacturing process (what is called thermal budget).

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. As the oxide 530c, a metal oxide that can be used as the oxide 530a or the oxide 530b can be used.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Furthermore, a metal nitride film of tantalum nitride or the like is preferable because it has a barrier property against hydrogen or oxygen.

Although the conductor 542a and the conductor 542b each having a single-layer structure are illustrated in FIG. 14A, a stacked-layer structure of two or more layers may be employed. For example, it is preferable to stack a tantalum nitride film and a tungsten film. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 14A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

As the insulator 544, it is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose the conductivity even after absorbing oxygen. Design is appropriately set in consideration of required transistor characteristics.

With the insulator 544, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably provided in contact with the inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high dielectric constant.

Although the conductor 560 functioning as the first gate electrode has a two-layer structure in FIG. 14A and FIG. 14B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

A conductive material containing tungsten, copper, or aluminum as its main component is preferably used for the conductor 560b. Furthermore, the conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Thus, oxygen can be supplied from the excess-oxygen regions into the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Thus, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

The conductor 546, the conductor 548, and the like are embedded in the insulator 520, the insulator 522, the insulator 524, the insulator 544, the insulator 580, the insulator 574, the insulator 581, and the insulator 582. The conductor 546 and the conductor 548 have a function of a plug or a wiring that connects the conductor 610b and the transistor 300, for example.

A conductor 546b, a conductor 548b, and the like are embedded in the insulator 580, the insulator 574, the insulator 581, and the insulator 582. The conductor 546b and the conductor 548b have a function of a plug or a wiring connected to the conductor 542a, the conductor 542b, or the like of the transistor 500.

The conductor 546, the conductor 546b, the conductor 548, and the conductor 548b can be provided using a material similar to those for the conductor 328 and the conductor 330.

Next, the conductor 610b is provided above the transistor 500. In the example illustrated in FIG. 1, the conductor 610b is provided over the insulator 582. In the example illustrated in FIG. 1, the conductor 610b is connected to the transistor 500 through the conductor 548b.

In addition to the conductor 610b, a conductor 610a may be provided over the insulator 582. The conductor 610a can be formed by processing the same conductive film as the conductor 610b, for example. An insulator 630 is provided over the conductor 610a and the conductor 610b, and a conductor 620 is further provided to overlap with the conductor 610a with the insulator 630 positioned therebetween, whereby the capacitor 600 including the conductor 610a, the conductor 620, and the insulator 630 can be provided over the insulator 582.

For the conductor 610a and the conductor 610b, it is possible to use a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 610a and the conductor 610b each having a single-layer structure are illustrated in FIG. 11, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. The insulator 640 may function as a planarization film that covers an uneven shape therebelow.

In the semiconductor device illustrated in FIG. 11, a conductor 631 is provided to be embedded in the insulator 640, and the conductor 632 is provided over the conductor 631. The conductor 631 can function as a plug electrically connected to the transistor 300. The conductor 632 is electrically connected to the transistor 300 through the conductor 631.

FIG. 11 illustrates an example of the semiconductor device formed on the substrate 311. The conductor 632 has a function of, for example, an electrode pad for making a connection to a circuit provided in a chip with a structure different from the structure provided on the substrate 311 by a bump, wire bonding, clip bonding, or the like.

Figure 15:
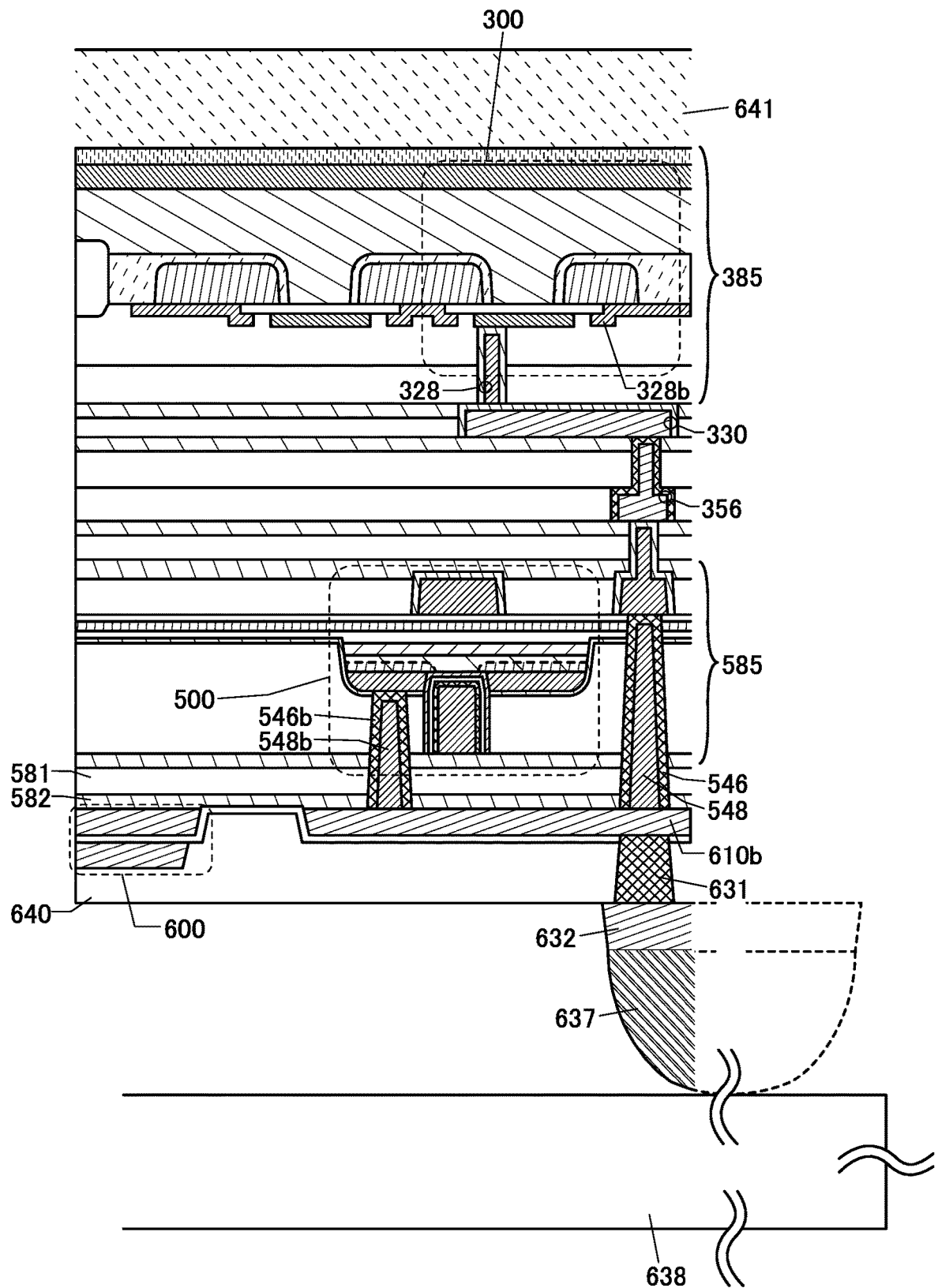
FIG. 15 is a diagram showing a structure example of an electronic component including a semiconductor device of one embodiment of the present invention.

FIG. 15 illustrates an example in which the semiconductor device illustrated in FIG. 11 is placed over a printed circuit board (PCB) 638 with a bump 637 positioned therebetween. In FIG. 15, a surface where the conductor 632 is exposed in the semiconductor device illustrated in FIG. 11 and the printed circuit board 638 are provided to face each other with the bump 637 positioned therebetween. A resin layer 641 or the like may be provided over the rear electrode 318 in order to keep the strength.

Figure 16:
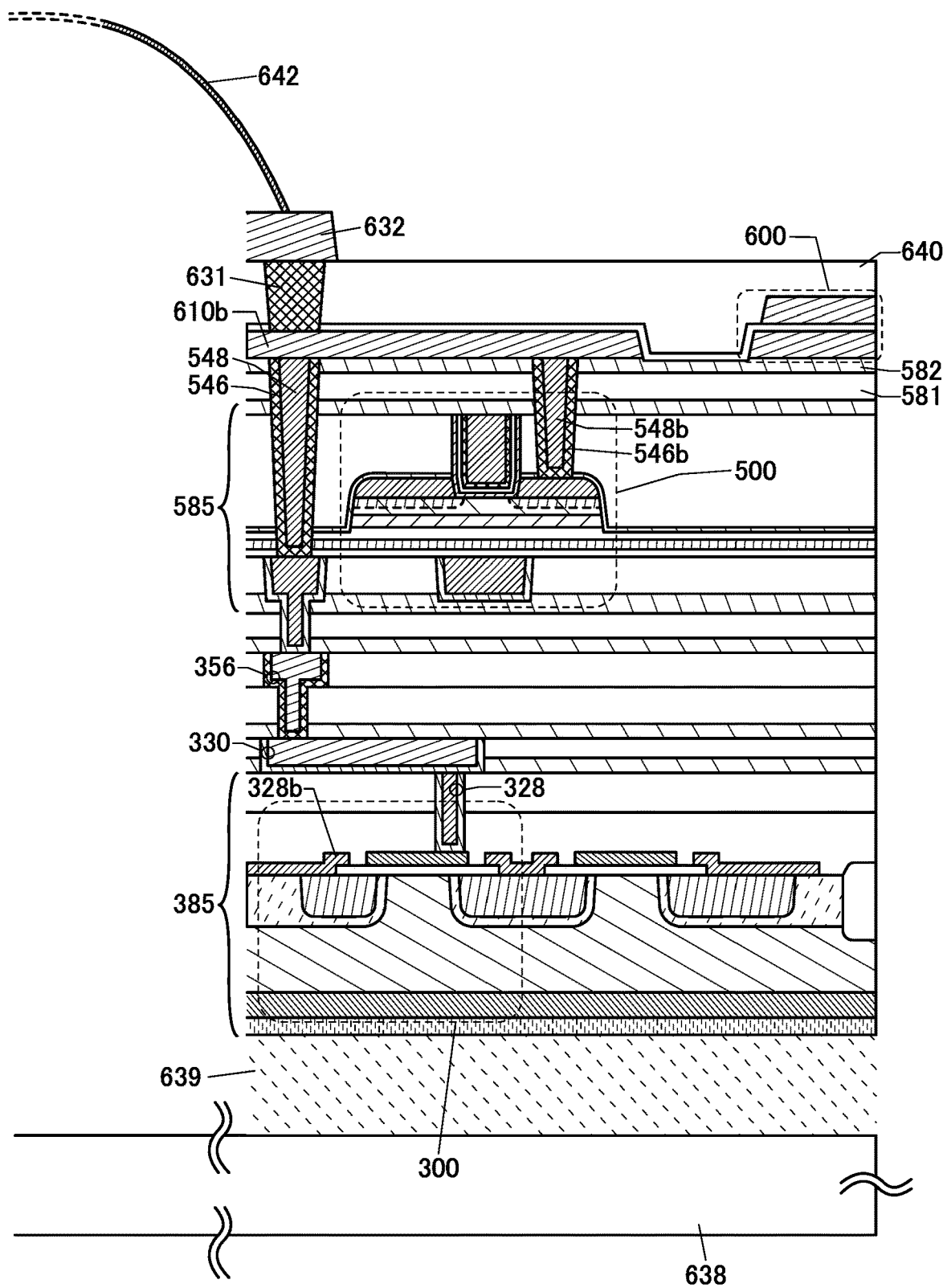
FIG. 16 is a diagram showing a structure example of an electronic component including a semiconductor device of one embodiment of the present invention.

FIG. 16 illustrates an example in which the semiconductor device illustrated in FIG. 11 is placed over the printed circuit board 638, and the conductor 632 and another chip are connected to each other by wire bonding. In FIG. 16, the semiconductor device is placed over the printed circuit board 638 such that the surface where the conductor 632 is exposed in the semiconductor device illustrated in FIG. 11 is regarded as a top surface. A surface provided with the rear electrode 318 and the printed circuit board 638 are provided to face each other with a resin layer 639 positioned therebetween. A wire 642 is bonded to the conductor 632.

Here, the conductor 632 is provided to overlap with a conductor connected to the diffusion layer 314a or the diffusion layer 314b of the transistor 300, whereby the conductor run length between the transistor 300 and the conductor 632 can be reduced and the resistance between the transistor 300 and the conductor 632 can be lowered. More specifically, for example, the conductor 632 is preferably provided to overlap with at least one of the conductor 328b and the conductor 328, as illustrated in FIG. 1. The conductor 356 and the conductor 518 are preferably provided such that at least parts thereof overlap with the conductor 632.

Since the resistance between the transistor 300 and the conductor 632 can be lowered by reducing the conductor run length between the transistor 300 and the conductor 632, for example, the thicknesses of wirings in the semiconductor device illustrated in FIG. 11, more specifically, the conductors provided in the insulator 326, the insulator 354, the insulator 516, and the like and the conductor 632, can be small. Accordingly, the semiconductor element in the semiconductor device illustrated in FIG. 11 can be miniaturized.

An assembled battery having high capacity is sometimes connected to the power storage device of one embodiment of the present invention. Rapid charge, rapid discharge, and the like are sometimes performed in the assembled battery connected to the power storage device of one embodiment of the present invention. Thus, a large amount of current might flow through the transistor 300.

In the case where a large amount of current flows through the transistor 300, the amount of heat generation of the transistor 300 might be large. In the OS transistor, a change in characteristics due to temperature change can be inhibited. Thus, the semiconductor device using an OS transistor as the transistor 500 can operate stably even when the amount of heat generation of the transistor 300 is large.

Figure 17:
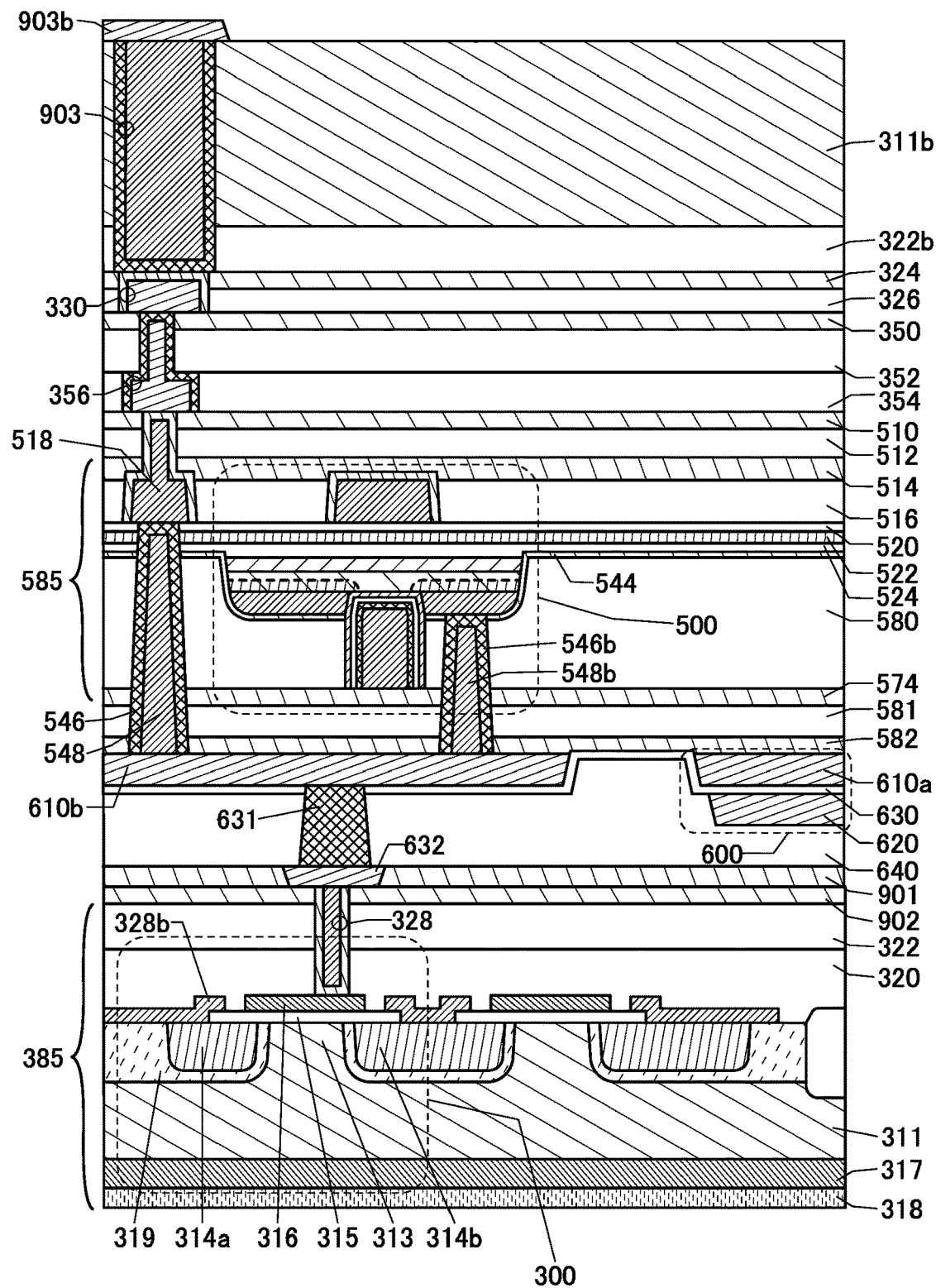
FIG. 17 is a cross-sectional view showing a structure example of a semiconductor device.

In a structure illustrated in FIG. 17, as a first structure body, the layer 585 including the transistor 500 is provided over a substrate 311b, the conductor 610b, the conductor 631, and the like are provided over the layer 585, and an insulator 901 and the conductor 632 provided to be embedded in the insulator 901 are provided over the conductor 631 and the like; as a second structure body, a structure including the layer 385 is provided and a stacked-layer structure of the insulator 322 and an insulator 902 over the insulator 322 is provided instead of the insulator 322 in the layer 385; and the first structure body and the second structure body are bonded to each other. An insulator 322b is provided over the substrate 311b, and a conductor 903 is provided to penetrate the substrate 311b and the insulator 322b. The conductor 903 and a printed circuit board can be positioned to face each other and the conductor 903 and a wiring over the printed circuit board can be electrically connected to each other using a bump.

Here, the conductor 328 and the conductor 632 preferably have the same metal element as a main component. Furthermore, the insulator 901 and the insulator 902 are preferably formed of the same component.

For the conductor 328 and the conductor 632, Cu, Al, Sn, Zn, W, Ag, Pt, or Au can be used, for example. Preferably, Cu, Al, W, or Au is used for easy bonding. For the insulator 901 and the insulator 902, silicon oxide, silicon oxynitride, silicon nitride oxide, silicon nitride, titanium nitride, or the like can be used.

That is, the same metal material described above is preferably used for the conductor 328 and the conductor 632. Furthermore, the same insulating material described above is preferably used for the insulator 901 and the insulator 902. With such a structure, the bonding can be performed with high yield.

Note that the conductor 328 and the conductor 632 may each have a multilayer structure of a plurality of layers; in that case, the outer layers (bonding surfaces) are formed of the same metal material. The insulator 901 and the insulator 902 may each have a multilayer structure of a plurality of layers; in that case, the outer layers (bonding surfaces) are formed of the same insulating material.

Through the above bonding, the electrical connection between the conductor 328 and the conductor 632 can be obtained favorably. Moreover, connection with sufficient mechanical strength can be obtained between the insulator 901 and the insulator 902.

For bonding metal layers to each other, a surface activated bonding method can be used in which an oxide film, a layer adsorbing impurities, and the like on surfaces are removed by sputtering treatment or the like and the cleaned and activated surfaces are brought into contact to be bonded to each other. Alternatively, a diffusion bonding method in which surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

Since the insulating layers and the metal layers coexist on their bonding surfaces, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

With the use of this structure, a change in electrical characteristics can be inhibited and the reliability can be improved in a semiconductor device using a transistor including an oxide semiconductor. Alternatively, a battery management circuit using a transistor including an oxide semiconductor can be miniaturized or highly integrated.

This embodiment can be combined with the description of the other embodiments as appropriate.

Embodiment 5

In this embodiment, a metal oxide of one embodiment of the present invention will be described.

<<Metal Oxide>>

For the oxide 530, a metal oxide functioning as an oxide semiconductor is preferably used. A metal oxide that can be used for the oxide 530 according to the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. In addition, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element Al, zinc, and oxygen (hereinafter, an (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. Meanwhile, a clear crystal grain boundary is difficult to observe in the CAAC-OS; thus, it can be said that a reduction in electron mobility due to the crystal grain boundary is less likely to occur. Entry of impurities, formation of defects, and the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained in some cases when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurity]

Here, the influence of each impurity in the metal oxide will be described.

Entry of impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is decreased in some cases. Moreover, when the channel formation region includes oxygen vacancies, the transistor tends to have normally-on characteristics.

The above-described defect states may include a trap state. Electric charges trapped by the trap states in the metal oxide take a long time to be released and may behave like fixed charges. Thus, a transistor whose channel formation region includes a metal oxide having a high density of trap states has unstable electrical characteristics in some cases.

If impurities exist in the channel formation region of the oxide semiconductor, the crystallinity of the channel formation region may decrease, and the crystallinity of an oxide provided in contact with the channel formation region may decrease. Low crystallinity of the channel formation region tends to result in a decrease in stability or reliability of the transistor. Moreover, if the crystallinity of the oxide provided in contact with the channel formation region is low, an interface state may be formed and the stability or reliability of the transistor may decrease.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by secondary ion mass spectrometry (SIMS) is lower than or equal to $1 \times 10^{18}$ atoms/cm$^3$, preferably lower than or equal to $2 \times 10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In some cases, bonding of part of hydrogen to oxygen bonded to a metal atom generates electrons serving as carriers.

Thus, a transistor using an oxide semiconductor that contains a large amount of hydrogen is likely to have normally-on characteristics. Moreover, hydrogen in an oxide semiconductor moves easily by a stress such as heat or an electric field; hence, a large amount of hydrogen in an oxide semiconductor might decrease the reliability of a transistor.

Accordingly, the amount of VoH in the metal oxide is preferably reduced as much as possible so that the metal oxide becomes a highly purified intrinsic or substantially highly purified intrinsic metal oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with impurities such as VoH sufficiently reduced is used for a channel formation region of a transistor, the transistor can have stable electrical characteristics.

An oxide semiconductor with a low carrier concentration is preferably used for a transistor. To reduce the carrier concentration of the oxide semiconductor, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of impurities in the oxide semiconductor include hydrogen, nitrogen, an alkali metal, an alkaline earth metal, iron, nickel, and silicon.

In particular, hydrogen contained in an oxide semiconductor reacts with oxygen bonded to a metal atom to be water, and thus forms oxygen vacancies in the oxide semiconductor in some cases. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy (VoH) can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, as the parameter of the oxide semiconductor, the carrier concentration assuming the state where an electric field is not applied is sometimes used instead of the donor concentration. That is, "carrier concentration" in this specification and the like can be replaced with "donor concentration" in some cases.

Consequently, hydrogen in the oxide semiconductor is preferably reduced as much as possible. Specifically, the hydrogen concentration in the oxide semiconductor that is obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with impurities such as hydrogen sufficiently reduced is used for a channel formation region of a transistor, the transistor can have stable electrical characteristics.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<<Other Semiconductor Materials>>

A semiconductor material that can be used for the oxide 530 is not limited to the above metal oxides. A semiconductor material that has a band gap (a semiconductor material that is not a zero-gap semiconductor) may be used for the oxide 530. For example, a single-element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and a chalcogenide. A chalcogenide is a compound containing a chalcogen. Chalcogen is a general term of elements belonging to Group 16, which includes oxygen, sulfur, selenium, tellurium, polonium, and livermorium. Examples of chalcogenides include transition metal chalcogenides and Group 13 chalcogenides.

As the oxide 530, a transition metal chalcogenide functioning as a semiconductor is preferably used, for example. Specific examples of the transition metal chalcogenide that can be used as the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically HfS$_2$), hafnium selenide (typically HfSe$_2$), zirconium sulfide (typically ZrS$_2$), and zirconium selenide (typically ZrSe$_2$).

This embodiment can be combined with the description of the other embodiments as appropriate.

Embodiment 6

In this embodiment, an example in which the amplifier described in the above embodiment is made into an electronic component will be described with reference to FIG. 18.

In this embodiment, an example of a chip 1200 on which the semiconductor device of the present invention is mounted is described with reference to FIG. 18. A plurality of circuits (systems) are mounted on the chip 1200. The technology for integrating a plurality of circuits (systems) into one chip is referred to as system on chip (SoC) in some cases.

Figure 18:
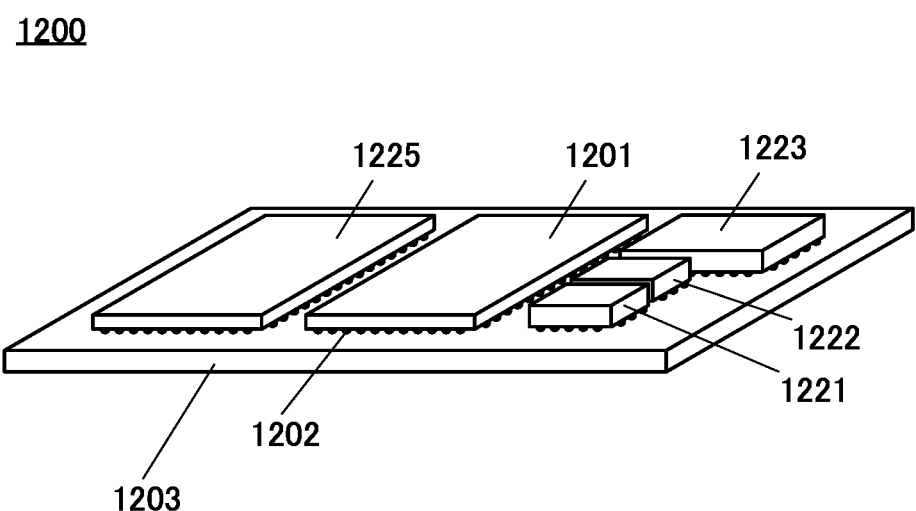
FIG. 18 is a diagram showing an example of an electronic component.

FIG. 18 illustrates an example in which a plurality of chips are provided over a printed circuit board 1203. In FIG. 18, a chip 1201 is provided over the printed circuit board 1203. The chip 1201 is provided with at least part of the semiconductor device of one embodiment of the present invention. For example, the chip 1201 is provided with the gate driver and the power supply control circuit of the semiconductor device described in the above embodiment. Moreover, the chip 1201 is provided with at least one of the power MOSFETs included in the semiconductor device described in the above embodiment. A plurality of bumps 1202 are provided on a rear surface of the chip 1201 and are connected to the printed circuit board 1203.

By the use of the structure of the semiconductor device of one embodiment of the present invention, circuits such as the gate driver and the power supply control circuit can be stacked and provided over the power MOSFET in one chip, so that the number of chips in the electronic component can be reduced.

The reduction in the number of chips enables stable circuit operation even in a vibrating environment. Mechanically strong connection between the chip and a connection electrode of the printed circuit board is performed with the use of the bump and electrical connection is performed reliably, whereby a structure more resistant to vibration can be obtained. Accordingly, the structure is suitable as, for example, an electronic component mounted on a vehicle, a portable terminal, or the like.

With the use of the structure of the semiconductor device of one embodiment of the present invention, chips can be integrated and the chips can be downsized, enabling downsizing of an electronic device. Moreover, power consumption can be reduced by the downsizing of the chips in some cases.

The printed circuit board 1203 shown in FIG. 18 includes a chip 1221, a chip 1222, and the like in addition to the chip 1201. The chip 1221 can be provided with the inductor 752, for example, and the chip 1222 can be provided with the capacitor 753, for example. Note that the inductor 752, the capacitor 753, and the like are sometimes provided in the chip 1201, not in a chip other than the chip 1201.

In the case where the amplifier of one embodiment of the present invention includes a plurality of power MOSFETs as in the example shown in FIG. 1, the power MOSFETs can be provided in the respective chips. For example, in the printed circuit board 1203 shown in FIG. 18, a first power MOSFET is provided in the chip 1201 and a second power MOSFET is provided in a chip 1225. Providing the power MOSFETs in the respective chips can reduce leakage between the MOSFETs.

Alternatively, in one chip, a plurality of power MOSFETs may be provided over the same substrate and a gate driver, a power supply control circuit, and the like may be stacked and provided over the plurality of power MOSFETs. This enables integration of the circuits.

The printed circuit board 1203 is preferably provided with an integrated circuit 1223. The integrated circuit 1223 has a function of supplying a control signal, power, or the like to the chip 1201. The integrated circuit 1223 includes, for example, a CPU, an arithmetic circuit, a converter circuit, and the like. The arithmetic circuit may have a function of performing image processing or a product-sum operation, for example. The converter circuit may include one or both of an A/D (analog/digital) converter circuit and a D/A (digital/analog) converter circuit, for example.

Memory devices such as a DRAM or a flash memory may be provided as a variety of chips provided on the printed circuit board 1203. The printed circuit board 1203 may be provided with a chip having a function of performing wireless communication.

This embodiment can be combined with the description of the other embodiments as appropriate.

Embodiment 7

In this embodiment, examples of electronic devices of embodiments of the present invention will be described.

Examples of electronic devices each including the amplifier of one embodiment of the present invention will be described with reference to FIG. 19.

The amplifier of one embodiment of the present invention can be used for an electronic device such as an audio reproducing device. The amplifier of one embodiment of the present invention can be used for a speaker or the like. The amplifier of one embodiment of the present invention can be used for an electronic device including a speaker, for example. Examples of the audio reproducing device include a car audio and a digital audio player. The amplifier of one embodiment of the present invention can be used for a headphone, an earphone, or the like.

The switching frequency for the transistor 762 and the transistor 763 by the gate driver 760 described in the above embodiment is preferably 10 times or more the frequency of an audio signal, for example. The switching frequency is preferably higher than or equal to 100 kHz and lower than or equal to 5 MHz, for example. The inductance of the inductor and the capacitance of the capacitor are preferably adjusted such that the cut-off frequency of the low-pass filter is in a band higher than the audible frequency band.

A cleaning robot 7000 shown in FIG. 19A includes a secondary battery, an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The cleaning robot 7000 is provided with a tire, an inlet, and the like. The cleaning robot 7000 can run autonomously, detect dust, and vacuum the dust through the inlet provided on the bottom surface.

The microphone has a function of detecting acoustic signals of a speaking voice of a user, an environmental sound, and the like. The speaker has a function of outputting audio signals such as a voice and a warning beep. The cleaning robot 7000 can analyze an audio signal input via the microphone and output a necessary audio signal from the speaker. The cleaning robot 7000 can communicate with the user with the use of the microphone and the speaker.

The amplifier of one embodiment of the present invention can be used for amplification of the audio signal input through the microphone and amplification of the audio signal output from the speaker.

The camera has a function of taking images of the surroundings of the cleaning robot 7000. The cleaning robot 7000 has a function of moving with use of the moving mechanism. The cleaning robot 7000 can take images of the surroundings with use of the camera and analyze the images to sense whether there is an obstacle in the way of the movement.

A smartphone 7210 shown in FIG. 19B is an example of a portable information terminal. The smartphone 7210 includes a microphone, a camera, a speaker, various kinds of sensors, and a display portion. The amplifier of one embodiment of the present invention can be used for amplification of the audio signal input through the microphone and amplification of the audio signal output from the speaker.

An earphone 7400 shown in FIG. 19C includes a main body 7401, a housing 7402, an ear hook 7403, and a circuit substrate 7404 disposed in the housing 7402. As the circuit substrate 7404, the chip described in the above embodiment and mounted with the amplifier of one embodiment of the present invention can be used. The use of the chip makes it possible to provide a small earphone. In addition, it is possible to provide a lightweight earphone.

The earphone 7400 preferably has a wireless communication function. The earphone 7400 preferably includes a secondary battery in the housing 7402. By including a secondary battery, the earphone can be used without wired connection to a power supply.

The earphone 7400 preferably has a wireless communication function. In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark). When having a wireless communication function, the earphone can be used without wired connection to a device outputting an audio signal.

A television 7500 shown in FIG. 19D includes a display portion 7501 and a speaker 7502. The amplifier of one embodiment of the present invention can be used for amplification of the audio signal output from the speaker.

FIG. 19E shows the interior of a vehicle 8400. The vehicle 8400 includes a display portion 8411, a speaker 8403, and a microphone 8404. The amplifier of one embodiment of the present invention can be used for amplification of the audio signal input through the microphone and amplification of the audio signal output from the speaker.

This embodiment can be combined with the description of the other embodiments as appropriate.

REFERENCE NUMERALS

21: transistor, 22: transistor, 23: transistor, 24: transistor, 25: transistor, 50: comparator, 101: buffer circuit, 102: level shift circuit, 103: buffer circuit, 104: buffer circuit, 111: transistor, 112: transistor, 113: capacitor, 114: capacitor, 121: transistor, 122: transistor, 131: inverter circuit, 132: inverter circuit, 141: transistor, 142: transistor, 143: transistor, 144: transistor, 151: transistor, 152: transistor, 153: transistor, 154: transistor, 155: capacitor, 211: control circuit, 212: photocoupler, 213: photocoupler, 214: reference voltage generation circuit, 215: reference voltage generation circuit, 216: reference voltage generation circuit, 300: transistor, 311: substrate, 311*b*: substrate, 313: semiconductor region, 314*a*: diffusion layer, 314*b*: diffusion layer, 315: insulator, 316: conductor, 317: diffusion layer, 318: rear electrode, 319: region, 320: insulator, 322: insulator, 322*b*: insulator, 324: insulator, 326: insulator, 328: conductor, 328*b*: conductor, 330: conductor, 350: insulator, 352: insulator, 354: insulator, 356: conductor, 385: layer, 500: transistor, 503: conductor, 503*a*: conductor, 503*b*: conductor, 510: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 540*a*: conductor, 540*b*: conductor, 542*a*: conductor, 542*b*: conductor, 543*a*: region, 543*b*: region, 544: insulator, 546: conductor, 546*b*: conductor, 548: conductor, 548*b*: conductor, 550: insulator, 560: conductor, 560*a*: conductor, 560*b*: conductor, 574: insulator, 580: insulator, 581: insulator, 582: insulator, 585: layer, 600: capacitor, 610*a*: conductor, 610*b*: conductor, 620: conductor, 630: insulator, 631: conductor, 632: conductor, 637: bump, 638: printed circuit board, 639: resin layer, 640: insulator, 641: resin layer, 642: wire, 750: amplifier, 751: semiconductor device, 752: inductor, 753: capacitor, 760: gate driver, 760*a*: driver circuit, 760*a*1: driver circuit, 760*a*2: driver circuit, 761: power supply control circuit, 762: transistor, 763: transistor, 771: comparator, 772: comparator, 773: carrier wave generation circuit, 774: resistor, 775: resistor, 776: capacitor, 777: resistor, 778: resistor, 779: capacitor, 791: terminal, 792: terminal, 793: terminal, 794: terminal, 795: terminal, 901: insulator, 902: insulator, 903: conductor, 1200: chip, 1201: chip, 1202: bump, 1203: printed circuit board, 1221: chip, 1222: chip, 1223: integrated circuit, 1225: chip, 7000: cleaning robot, 7210: smartphone, 7400: earphone, 7401: main body, 7402: housing, 7403: ear hook, 7404: circuit substrate, 7500: television, 7501: display portion, 7502: speaker, 8400: vehicle, 8403: speaker, 8404: microphone, 8411: display portion

The invention claimed is:

1. A semiconductor device comprising a first transistor, a second transistor, a gate driver, a first comparator circuit, a second comparator circuit, and a first terminal,
   wherein the gate driver comprises a third transistor and a fourth transistor,
   wherein one of a source and a drain of the first transistor and one of a source and a drain of the second transistor are electrically connected to the first terminal,
   wherein the third transistor and the fourth transistor are each stacked over the first transistor,
   wherein one of a source and a drain of the third transistor and one of a source and a drain of the fourth transistor are electrically connected to a gate of the first transistor,
   wherein the third transistor and the fourth transistor each comprise a metal oxide in a channel formation region,
   wherein the metal oxide comprises at least indium,
   wherein the first comparator circuit is supplied with an analog signal and a first potential, wherein the first comparator circuit is configured to output, as a first output signal, a signal responsive to a result of comparing the analog signal and the first potential, wherein the second comparator circuit is supplied with the first output signal and a carrier wave, wherein the second comparator circuit is configured to output, as a second output signal, a signal responsive to a result of comparing the first output signal and the carrier wave, and wherein the gate driver is configured to supply a desired potential to each of the gate of the first transistor and a gate of the second transistor and thereby outputting a signal responsive to the second output signal to the first terminal.

2. The semiconductor device according to claim 1, wherein the first transistor comprises, in a channel formation region, one or more selected from silicon, germanium, silicon-germanium, gallium arsenide, gallium aluminum arsenide, indium phosphide, silicon carbide, zinc selenide, gallium nitride, and gallium oxide.

3. The semiconductor device according to claim 1, wherein the metal oxide further comprises zinc.

4. The semiconductor device according to claim 1, wherein the carrier wave is a triangular wave.

5. An amplifier comprising a first transistor, a second transistor, a gate driver, a power supply control circuit, an inductor, a capacitor, a first terminal, a second terminal, and a third terminal, wherein the gate driver comprises a third transistor and a fourth transistor, wherein the third transistor and the fourth transistor are each stacked over the first transistor, wherein one of a source and a drain of the first transistor and one of a source and a drain of the second transistor are electrically connected to the first terminal, wherein one of a source and a drain of the third transistor and one of a source and a drain of the fourth transistor are electrically connected to a gate of the first transistor, wherein the third transistor and the fourth transistor each comprise a metal oxide in a channel formation region, wherein the metal oxide comprises at least indium, wherein the power supply control circuit is electrically connected to the gate driver and the second terminal, wherein one terminal of the inductor is electrically connected to the first terminal, wherein the other terminal of the inductor is electrically connected to the third terminal and one terminal of the capacitor, wherein the power supply control circuit is configured to generate a signal based on an analog signal supplied from the second terminal and supplying the signal to the gate driver, and wherein the amplifier is configured to output, from the third terminal, a signal obtained by amplifying the analog signal.

6. The amplifier according to claim 5, wherein the power supply control circuit comprises a first comparator circuit and a second comparator circuit, wherein the first comparator circuit is configured to output, as a first output signal, a signal responsive to a result of comparing the analog signal and a first potential, wherein the second comparator circuit is configured to output, as a second output signal, a signal responsive to a result of comparing the first output signal and a carrier wave, and wherein the gate driver is configured to supply a desired potential to each of the gate of the first transistor and a gate of the second transistor and thereby outputting a signal responsive to the second output signal to the first terminal.

7. The amplifier according to claim 5, wherein at least one of the first terminal and the third terminal is electrically connected to the second terminal.

8. An electronic device comprising the amplifier according to claim 5.

9. The semiconductor device according to claim 5, wherein the first transistor comprises, in a channel formation region, one or more selected from silicon, germanium, silicon-germanium, gallium arsenide, gallium aluminum arsenide, indium phosphide, silicon carbide, zinc selenide, gallium nitride, and gallium oxide.

10. The semiconductor device according to claim 5, wherein the metal oxide further comprises zinc.

11. A semiconductor device comprising a first transistor, an insulating layer over the first transistor, a conductive layer, and a gate driver, wherein part of the conductive layer is provided to be embedded in the insulating layer, wherein the gate driver comprises a second transistor and a third transistor, wherein the second transistor and the third transistor are each stacked over the first transistor, wherein the second transistor and the third transistor each comprise a metal oxide in a channel formation region, wherein the metal oxide comprises indium and zinc, wherein one of a source and a drain of the second transistor and one of a source and a drain of the third transistor are electrically connected to a gate of the first transistor through the conductive layer, wherein the gate driver is configured to be supplied with a first potential and a second potential, and wherein the gate driver is configured to select the first potential or the second potential and supplying the first potential selected or the second potential selected to the gate of the first transistor.

12. The semiconductor device according to claim 11, wherein the gate driver comprises a level shift circuit, and wherein the level shift circuit is configured to generate a potential to be supplied to each of a gate of the second transistor and a gate of the third transistor.

13. The semiconductor device according to claim 11, wherein the first transistor comprises, in a channel formation region, one or more selected from silicon, germanium, silicon-germanium, gallium arsenide, gallium aluminum arsenide, indium phosphide, silicon carbide, zinc selenide, gallium nitride, and gallium oxide.

14. The semiconductor device according to claim 11, wherein the metal oxide further comprises one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, and magnesium.

15. The semiconductor device according to claim 11, further comprising:

a first diffusion layer;
a semiconductor region and a second diffusion layer that are over the first diffusion layer;
a gate electrode over the semiconductor region; and
a source electrode over the second diffusion layer,
wherein the first diffusion layer comprises a region configured to be a drain of the first transistor,
wherein the semiconductor region comprises a region configured to be the channel formation region of the first transistor, and
wherein the second diffusion layer comprises a region configured to be a source of the first transistor.

16. The semiconductor device according to claim 15, further comprising a second semiconductor region joined to the semiconductor region,
wherein a polarity of the second diffusion layer and a polarity of the second semiconductor region are different from each other, and
wherein the first diffusion layer, the second semiconductor region, and the second diffusion layer each comprise a region configured to be part of a diode element.

17. The semiconductor device according to claim 16, wherein the second semiconductor region is a region joined to the second diffusion layer.

18. The semiconductor device according to claim 17, wherein the second semiconductor region and the second diffusion layer form a pn junction.

* * * * *